United States Patent
Kim et al.

(10) Patent No.: US 11,589,663 B2
(45) Date of Patent: Feb. 28, 2023

(54) DECORATION MEMBER

(71) Applicant: LG CHEM, LTD., Seoul (KR)

(72) Inventors: Yong Chan Kim, Daejeon (KR); Ki Hwan Kim, Daejeon (KR); Nansra Heo, Daejeon (KR); Jeong Woo Shon, Daejeon (KR); Pilsung Jo, Daejeon (KR)

(73) Assignee: LG Chem, Ltd., Seoul (KR)

( * ) Notice: Subject to any disclaimer, the term of this patent is extended or adjusted under 35 U.S.C. 154(b) by 136 days.

(21) Appl. No.: 16/965,547

(22) PCT Filed: Jun. 14, 2019

(86) PCT No.: PCT/KR2019/007242
§ 371 (c)(1),
(2) Date: Jul. 28, 2020

(87) PCT Pub. No.: WO2019/240554
PCT Pub. Date: Dec. 19, 2019

(65) Prior Publication Data
US 2021/0046734 A1  Feb. 18, 2021

(30) Foreign Application Priority Data

Jun. 15, 2018 (KR) .................. 10-2018-0069234
Oct. 31, 2018 (KR) .................. 10-2018-0132115

(51) Int. Cl.
*B32B 15/082* (2006.01)
*B32B 15/20* (2006.01)
(Continued)

(52) U.S. Cl.
CPC ............. *A45D 33/18* (2013.01); *A45D 34/00* (2013.01); *A45D 40/00* (2013.01); *B29C 45/26* (2013.01);
(Continued)

(58) Field of Classification Search
CPC ........ A45D 33/18; A45D 34/00; A45D 40/00; A45D 2034/007; A45D 2040/0012; B29C 45/26; B32B 15/082; B32B 15/20; B32B 2255/10; B32B 2255/20; B32B 2451/00; B32B 2307/4023; B32B 2307/416;
(Continued)

(56) References Cited

U.S. PATENT DOCUMENTS 6,236,510 B1  5/2001  Bradley, Jr. et al.
6,602,578 B1  8/2003  Tompkin et al.
(Continued)

FOREIGN PATENT DOCUMENTS

CN  1345274 A  4/2002
CN  1630587 A  6/2005
(Continued)

*Primary Examiner* — Humera N. Sheikh
*Assistant Examiner* — Kevin C T Li
(74) *Attorney, Agent, or Firm* — Dentons US LLP

(57) ABSTRACT

The present disclosure relates to a decoration member comprising a color developing layer comprising a light reflective layer and a light absorbing layer provided on the light reflective layer; and a substrate provided on one surface of the color developing layer, wherein the light absorbing layer comprises a molybdenum-titanium oxide ($Mo_aTi_bO_x$).

14 Claims, 20 Drawing Sheets

(51) Int. Cl.

| | | |
|---|---|---|
| *A45D 33/18* | (2006.01) | |
| *C08J 7/04* | (2020.01) | |
| *A45D 34/00* | (2006.01) | |
| *A45D 40/00* | (2006.01) | |
| *C03C 17/245* | (2006.01) | |
| *G02B 5/00* | (2006.01) | |
| *G02B 5/26* | (2006.01) | |
| *B29C 45/26* | (2006.01) | |
| *G02B 5/28* | (2006.01) | |
| *G02B 5/04* | (2006.01) | |
| *C23C 14/00* | (2006.01) | |

(52) U.S. Cl.
CPC ............ *B32B 15/082* (2013.01); *B32B 15/20* (2013.01); *C03C 17/245* (2013.01); *C08J 7/0423* (2020.01); *C23C 14/0036* (2013.01); *G02B 5/003* (2013.01); *G02B 5/045* (2013.01); *G02B 5/26* (2013.01); *G02B 5/285* (2013.01); *A45D 2034/007* (2013.01); *A45D 2040/0012* (2013.01); *B29K 2901/12* (2013.01); *B29K 2995/002* (2013.01); *B32B 2307/4023* (2013.01); *B32B 2307/416* (2013.01); *B32B 2311/04* (2013.01); *B32B 2311/08* (2013.01); *B32B 2311/18* (2013.01); *B32B 2311/22* (2013.01); *B32B 2311/24* (2013.01); *B32B 2439/00* (2013.01); *C03C 2217/72* (2013.01); *C03C 2218/155* (2013.01); *C08J 2367/02* (2013.01)

(58) Field of Classification Search
CPC ............ B32B 2311/04; B32B 2311/08; B32B 2311/18; B32B 2311/22; B32B 2311/24; B32B 2439/00; C03C 17/245; C03C 17/42; C03C 17/38; C03C 17/36; C03C 17/003; C03C 17/3644; C03C 17/3647; C03C 2217/72; C03C 2218/155; C08J 7/0423; C08J 2367/02; C08J 7/18; C23C 14/0036; C23C 14/00; C23C 28/00; C23C 28/30; G02B 5/003; G02B 5/045; G02B 5/26; G02B 5/285; G02B 5/136; B29K 2901/12; B29K 2995/002; C08L 101/00; B44F 1/14; B65D 1/02
See application file for complete search history.

(56) References Cited

U.S. PATENT DOCUMENTS

| | | |
|---|---|---|
| 6,686,042 B1 | 2/2004 | LeGallee |
| 6,797,366 B2 | 9/2004 | Hanson et al. |
| 7,923,122 B2 | 4/2011 | Korechika et al. |
| 8,287,994 B2 | 10/2012 | Fukawa et al. |
| 9,903,989 B2 | 2/2018 | Kim et al. |
| 2004/0013805 A1 | 1/2004 | Nagata et al. |
| 2005/0063067 A1* | 3/2005 | Phillips ............... G07D 7/0032 359/613 |
| 2005/0127663 A1 | 6/2005 | Heim |
| 2010/0128204 A1 | 5/2010 | Omote et al. |
| 2011/0177300 A1 | 7/2011 | Hankey et al. |
| 2011/0273356 A1 | 11/2011 | Kawaguchi et al. |
| 2013/0251947 A1 | 9/2013 | Lazarev |
| 2015/0192897 A1 | 7/2015 | Schilling et al. |
| 2015/0212244 A1* | 7/2015 | Kim ....................... C23C 14/34 204/192.28 |
| 2018/0033893 A1 | 2/2018 | Lee et al. |
| 2018/0046017 A1 | 2/2018 | Lee et al. |
| 2018/0267638 A1 | 9/2018 | Yoon et al. |
| 2019/0302317 A1 | 10/2019 | Jones et al. |
| 2020/0062027 A1 | 2/2020 | Shon et al. |
| 2020/0114621 A1 | 4/2020 | Kim et al. |
| 2021/0016540 A1 | 1/2021 | Jo et al. |

FOREIGN PATENT DOCUMENTS

| | | |
|---|---|---|
| CN | 102725663 A | 10/2012 |
| CN | 202518003 U | 11/2012 |
| CN | 10245884 A | 12/2014 |
| CN | 104903117 A | 9/2015 |
| CN | 107112075 A | 8/2017 |
| CN | 107521251 A | 12/2017 |
| CN | 111683562 A | 9/2020 |
| DE | 102016007649 A1 | 12/2017 |
| EP | 2420391 A2 | 2/2012 |
| EP | 3 725 516 A1 | 10/2020 |
| JP | 11-264063 A | 9/1999 |
| JP | 2005-516829 A | 6/2005 |
| JP | 2008-229997 A | 10/2008 |
| JP | 2009-80205 A | 4/2009 |
| JP | 4304001 B2 | 7/2009 |
| JP | 2009168928 A | 7/2009 |
| JP | 2010-173273 A | 8/2010 |
| JP | 2010-197798 A | 9/2010 |
| JP | 2010188713 A | 9/2010 |
| JP | 2011173379 A | 9/2011 |
| JP | 2011-256424 A | 12/2011 |
| JP | 2015068849 A | 4/2015 |
| JP | 2016218913 A | 12/2016 |
| KR | 10-2008-0078523 A | 8/2008 |
| KR | 10-2010-0135837 A | 12/2010 |
| KR | 10-2014-0029333 A | 3/2014 |
| KR | 10-2016-0085132 A | 7/2016 |
| KR | 1020170133109 A | 12/2017 |
| TW | 201022051 A | 6/2010 |
| WO | 0031571 A1 | 6/2000 |
| WO | 2000/043565 A1 | 7/2000 |
| WO | 2002/024818 A1 | 3/2002 |
| WO | 2009008403 A1 | 1/2009 |
| WO | 2016137282 A1 | 9/2016 |
| WO | 2016159602 A1 | 10/2016 |
| WO | 2017-214007 A1 | 12/2017 |
| WO | 2018030355 A1 | 2/2018 |
| WO | 2018/164464 A1 | 9/2018 |
| WO | 2019004722 A1 | 1/2019 |

* cited by examiner

[FIG. 1]
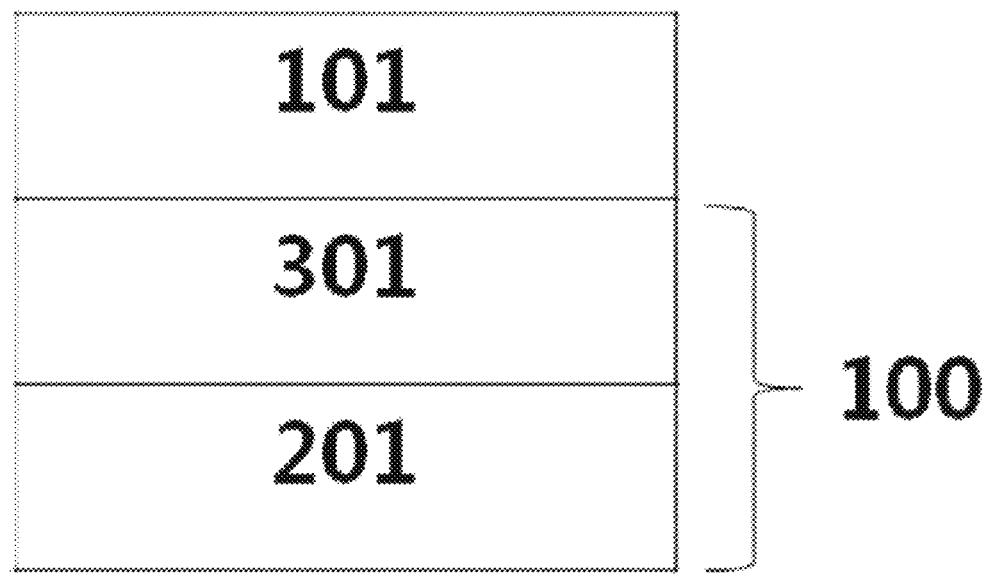
[FIG. 2]
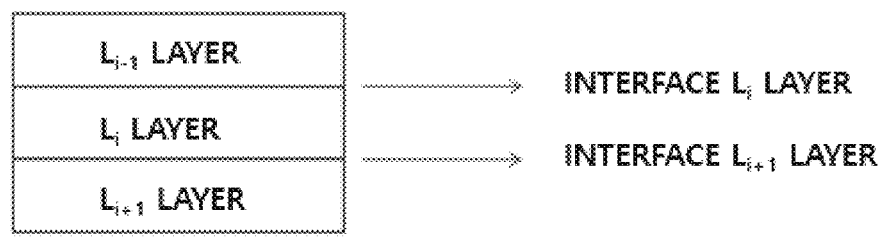

[FIG. 3]
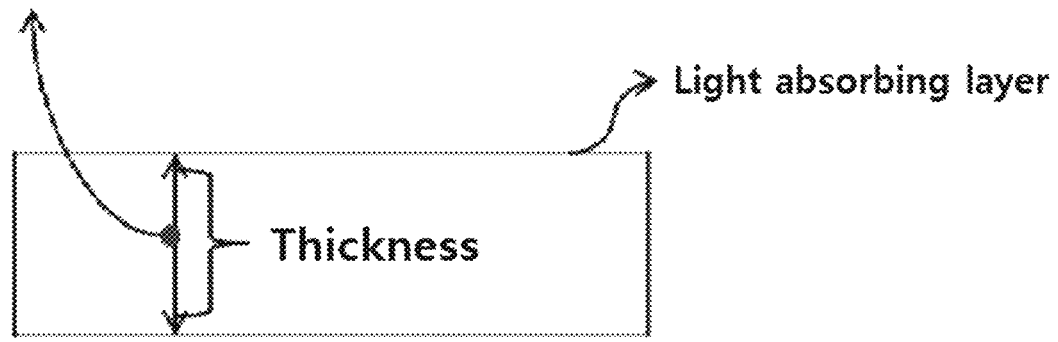

[FIG. 4]
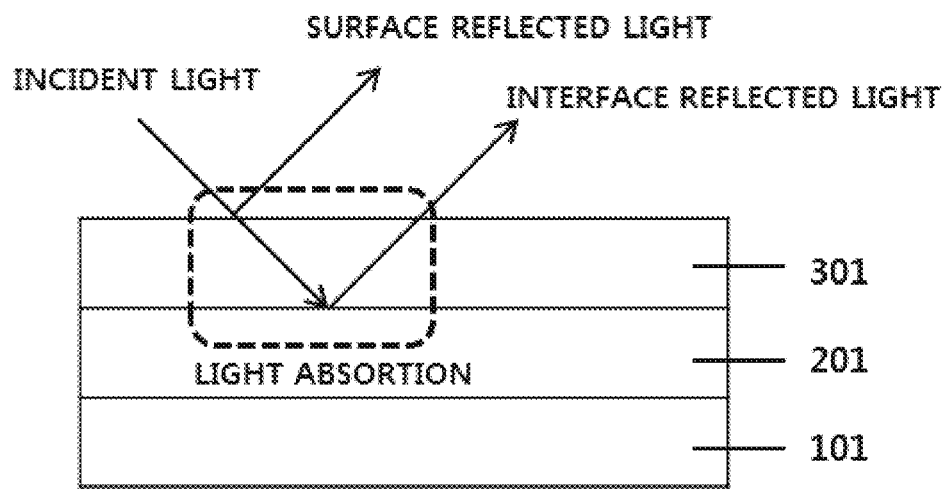
[FIG. 5]
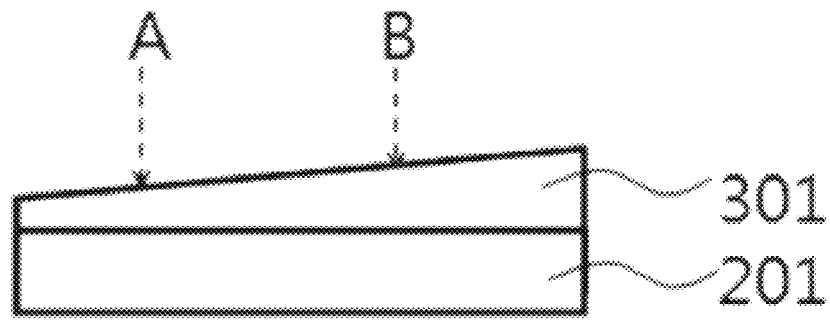
[FIG. 6]
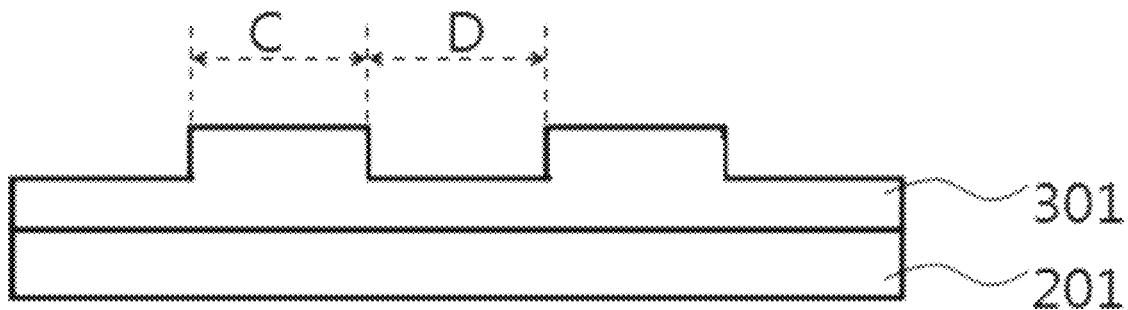

[FIG. 7]
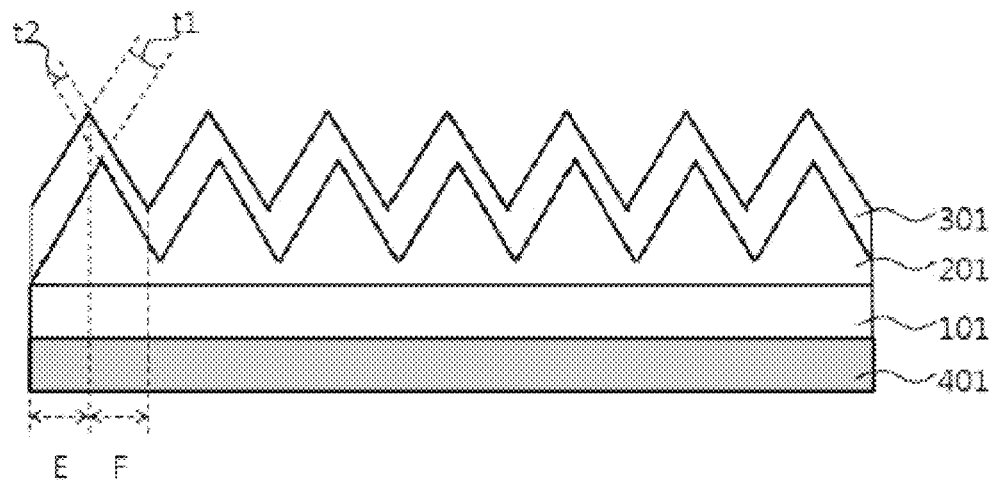
[FIG. 8]
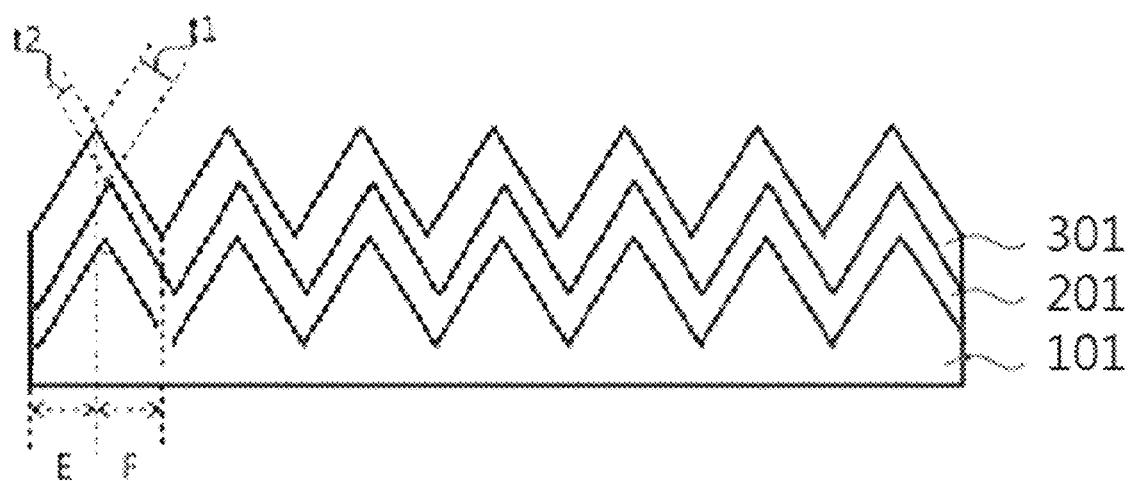
[FIG. 9]
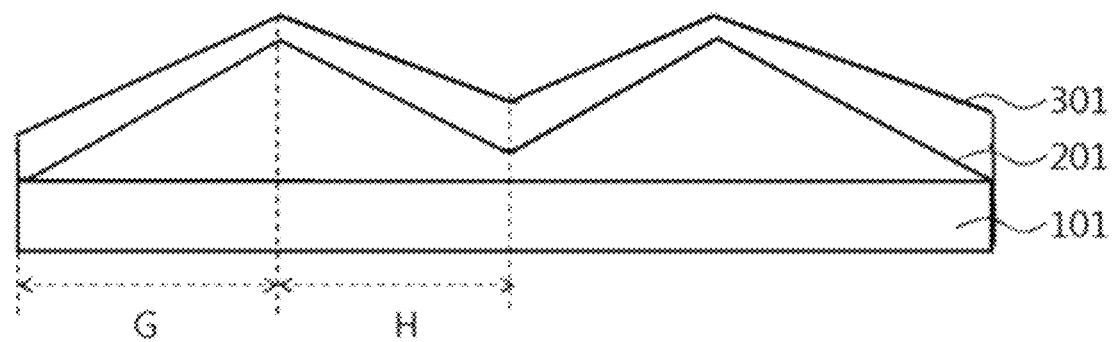

[FIG. 10]
(a) Observing Direction
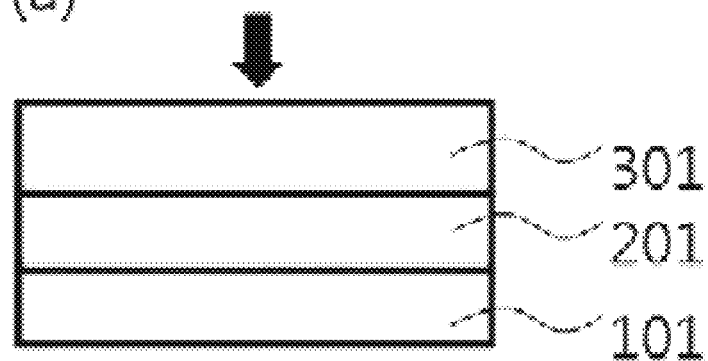
(b) Observing Direction
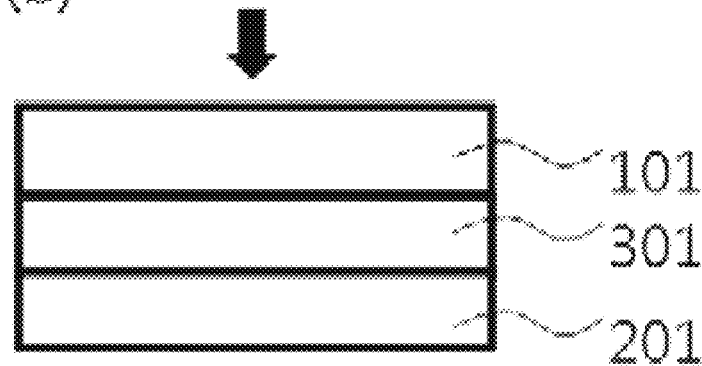

[FIG. 11]
(a) Observing Direction
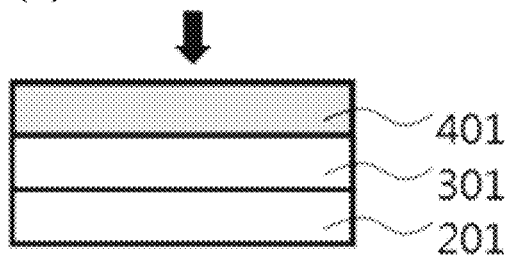
(b) Observing Direction
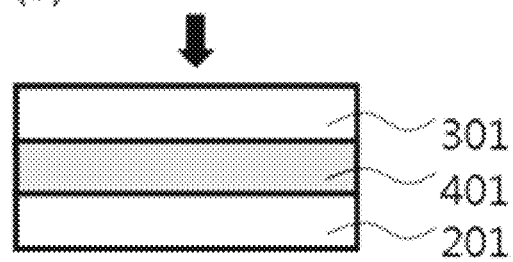
(c) Observing Direction
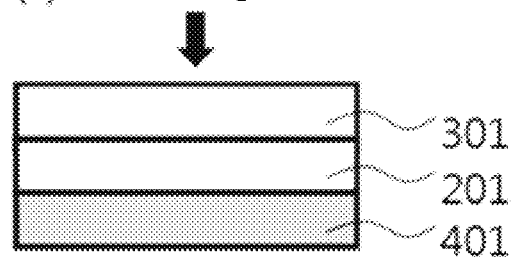

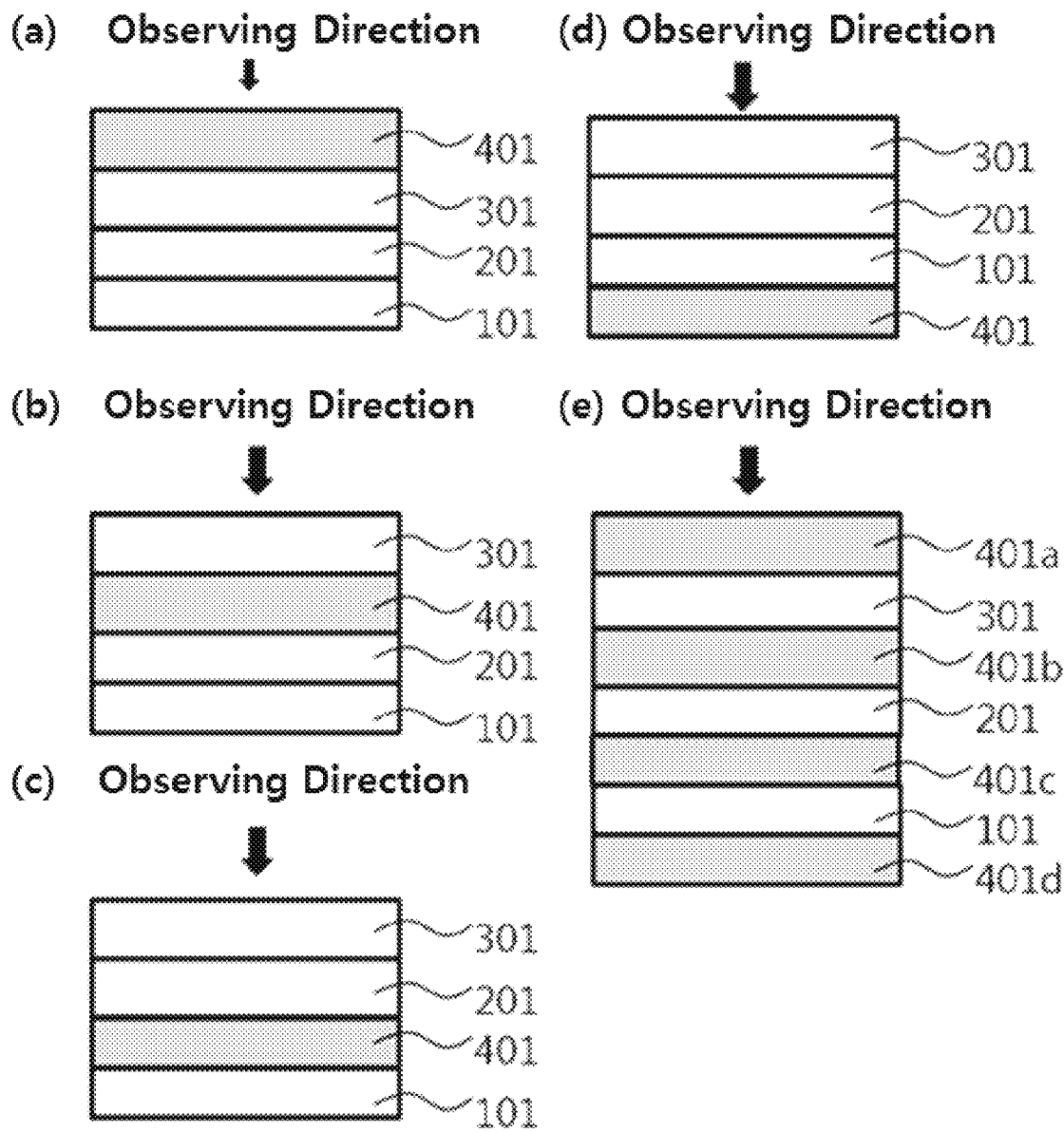

[FIG. 13]
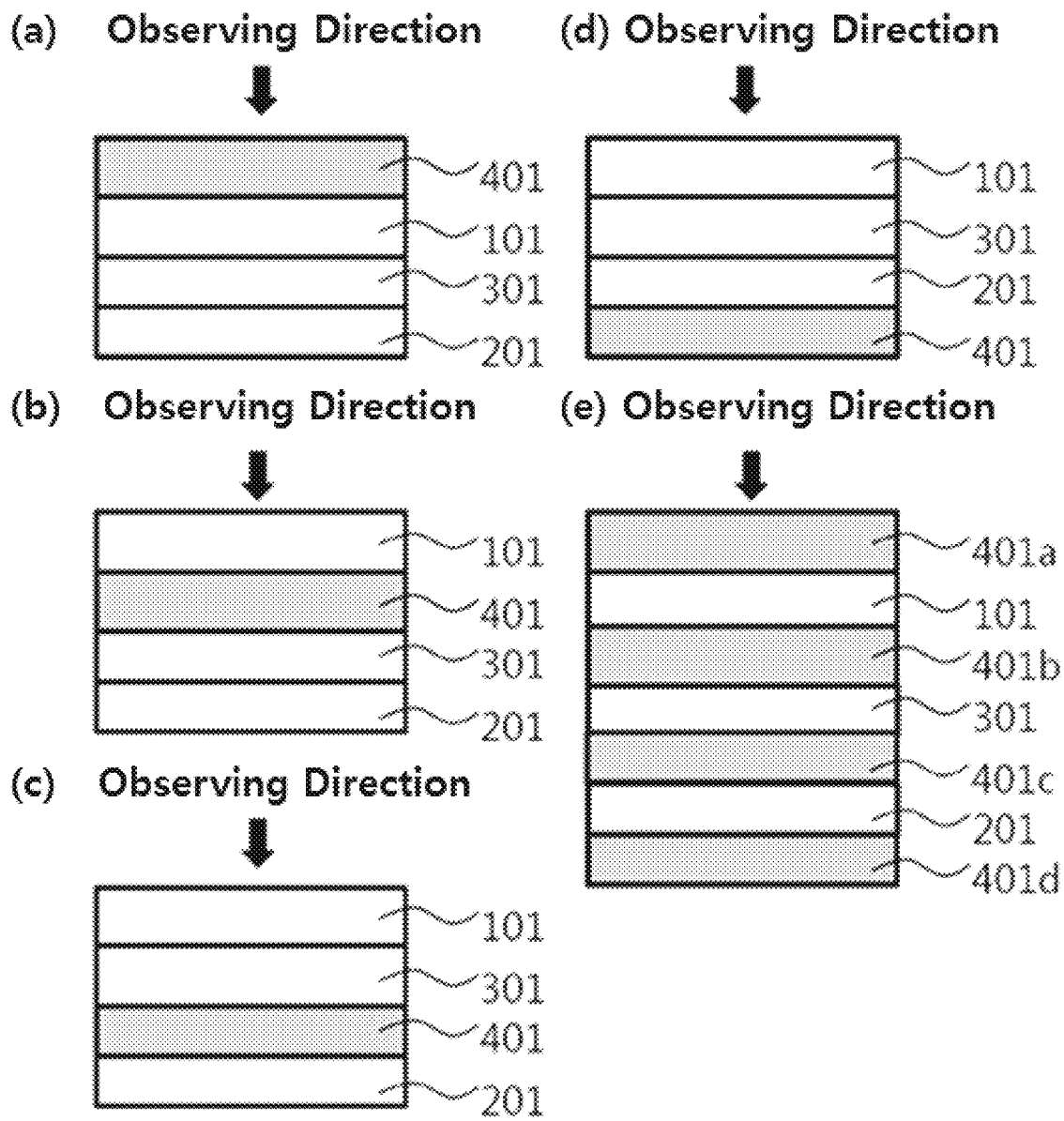

[FIG. 14]
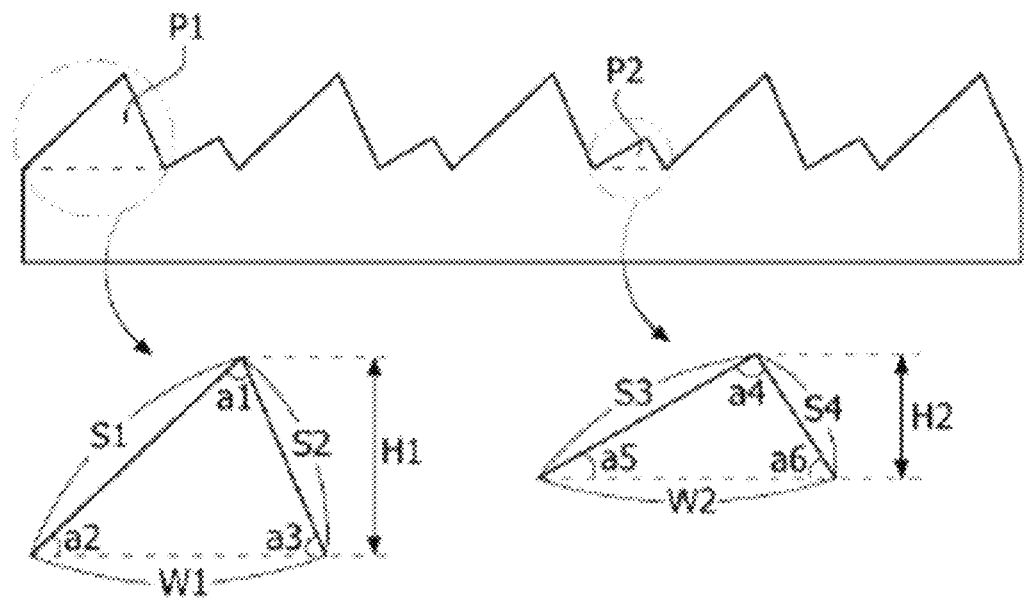
[FIG. 15]
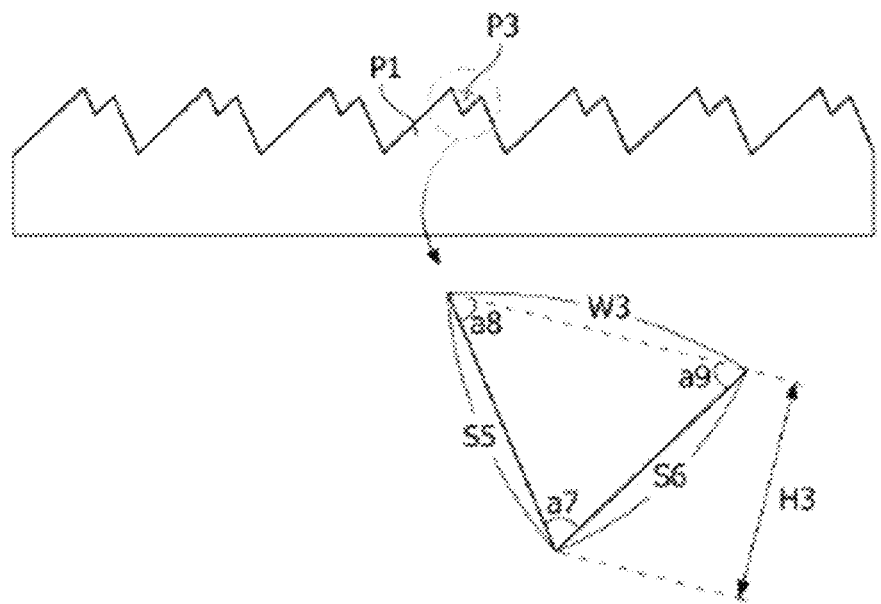

[FIG. 16]
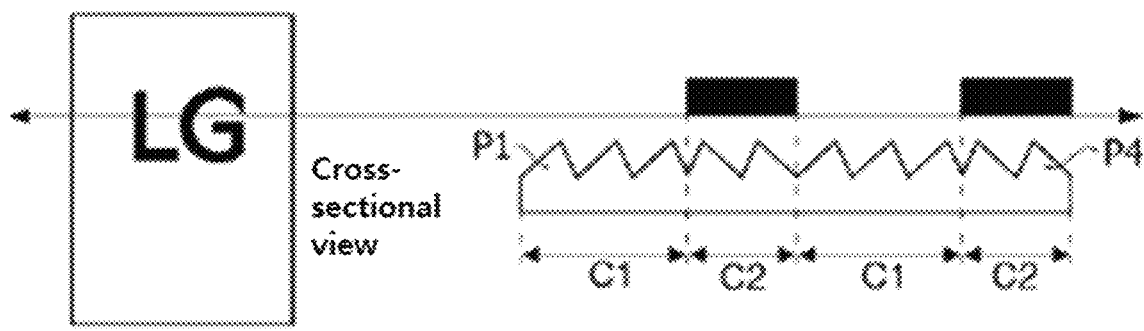
(a)
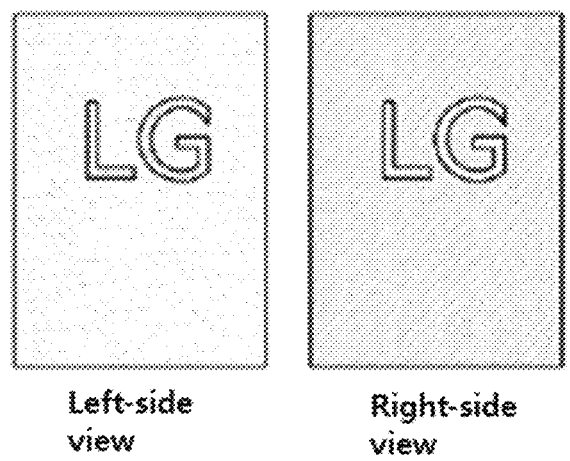
(b)

[FIG. 17]
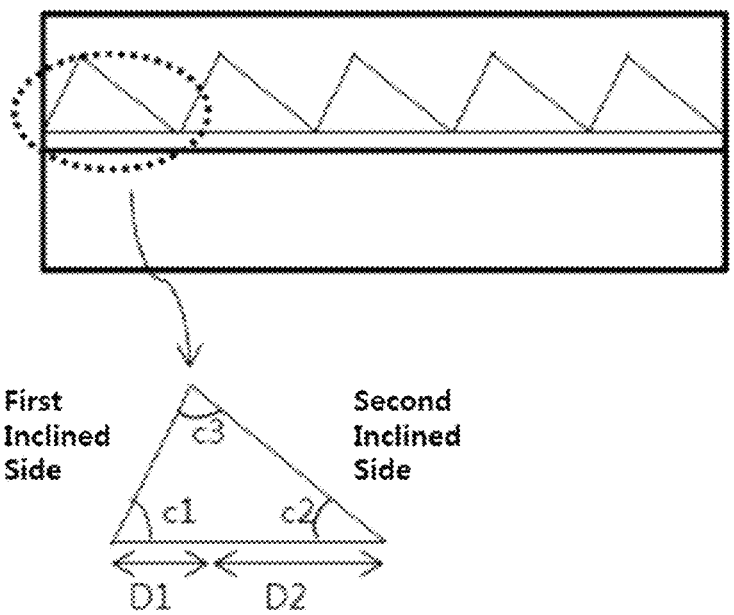
[FIG. 18]
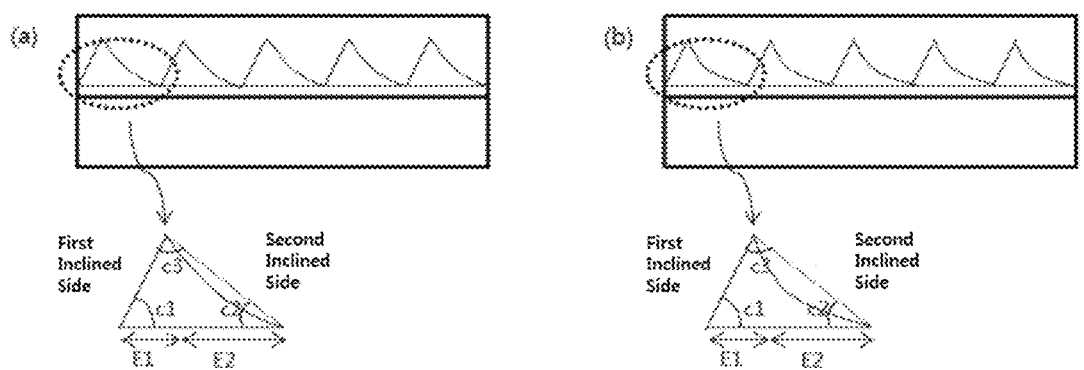

[FIG. 19]
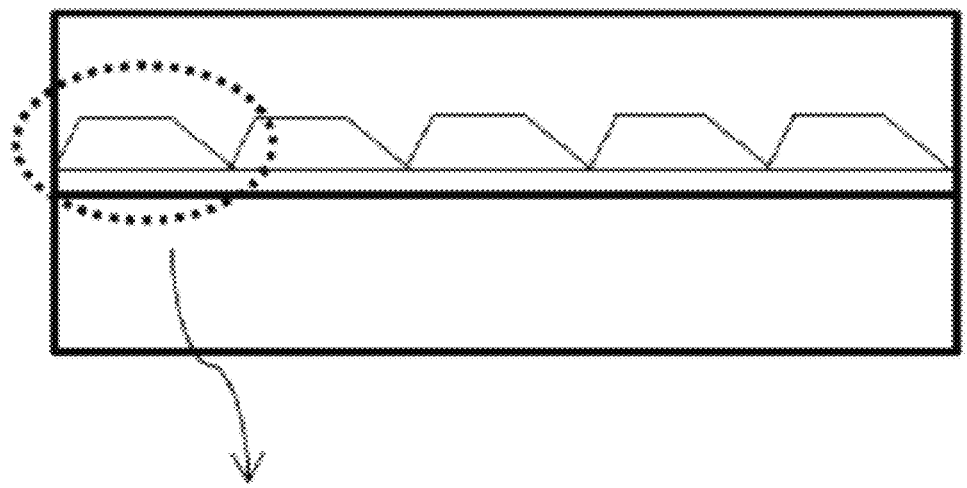
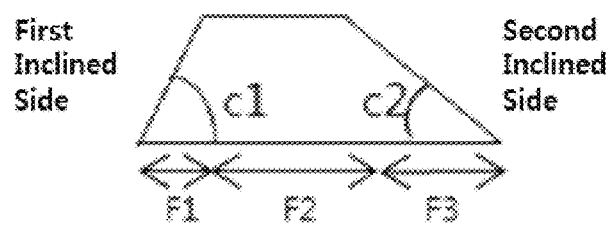
[FIG. 20]
(a) 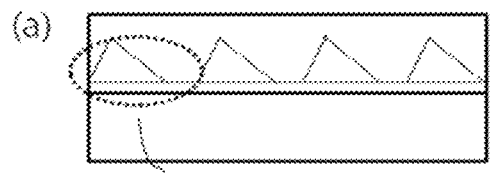
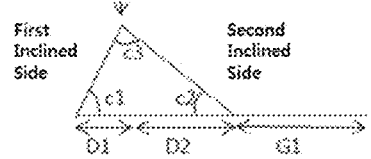
(b) 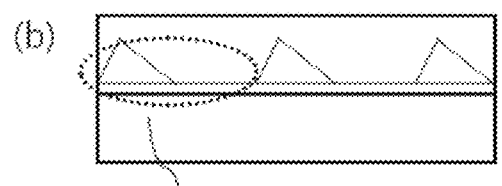
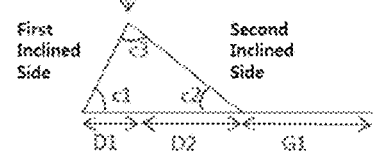

[FIG. 21]
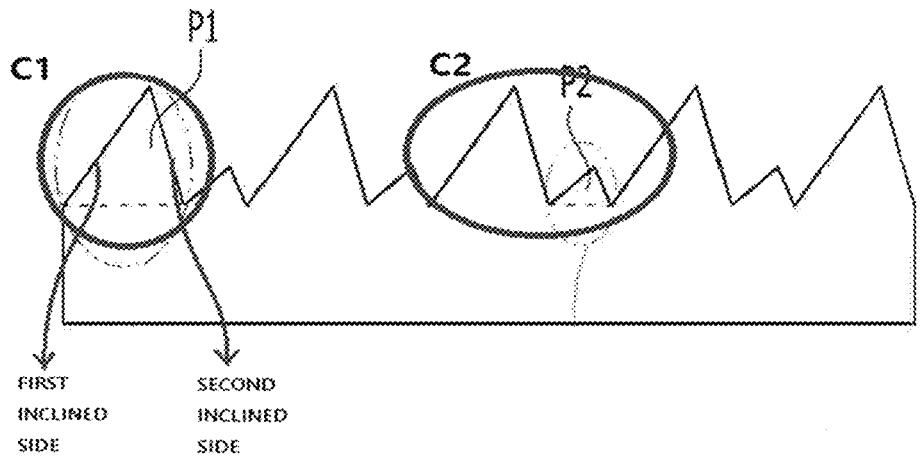
FIRST INCLINED SIDE
SECOND INCLINED SIDE
[FIG. 22]
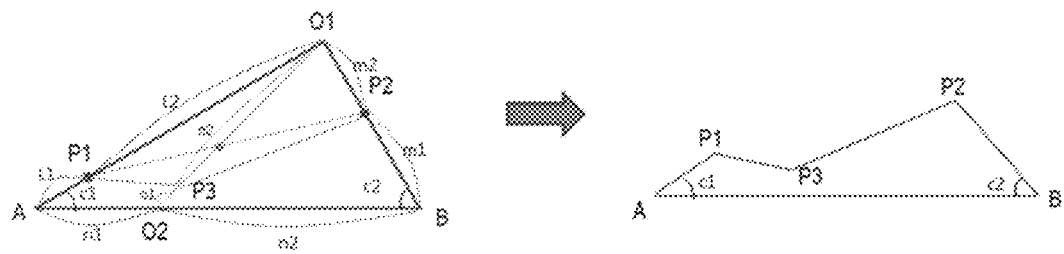
[FIG. 23]
[FIG. 24]
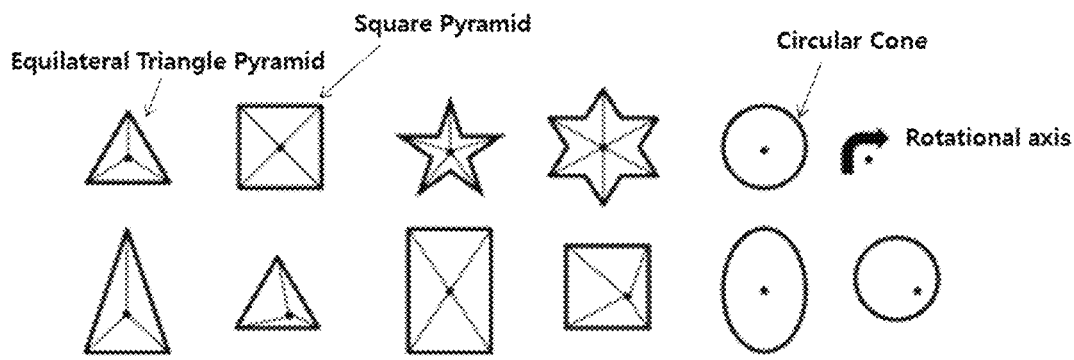

[FIG. 25]
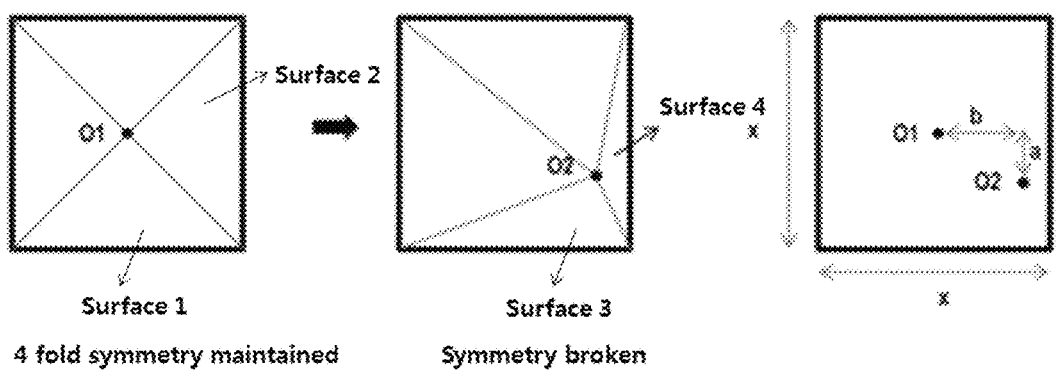
[FIG. 26]
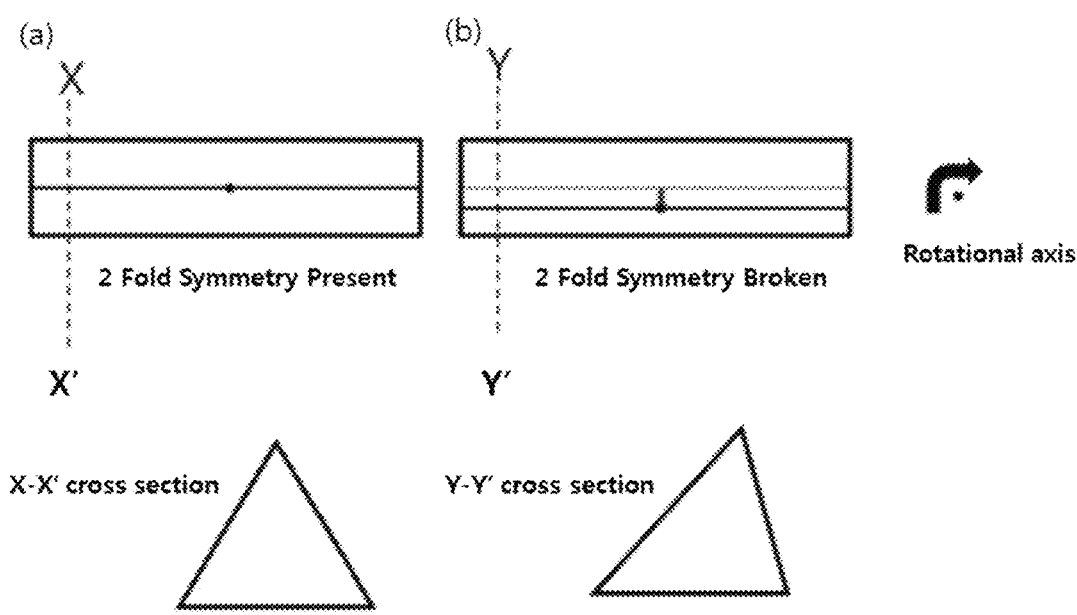

[FIG. 27]
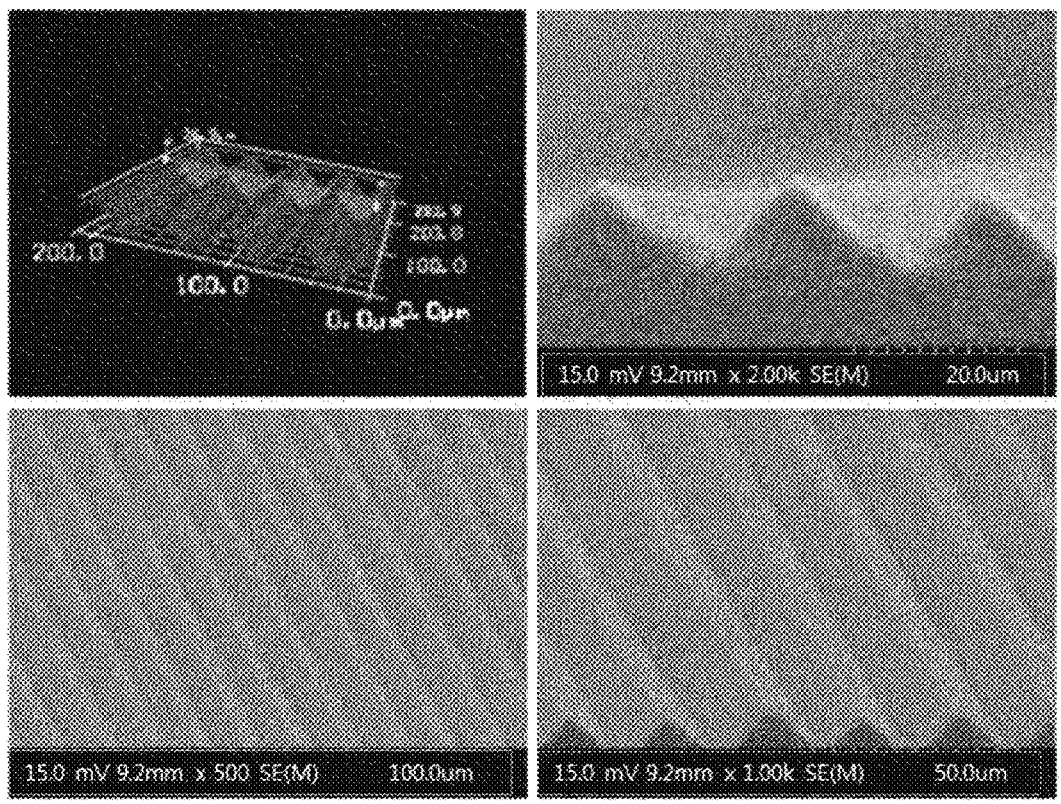
[FIG. 28]
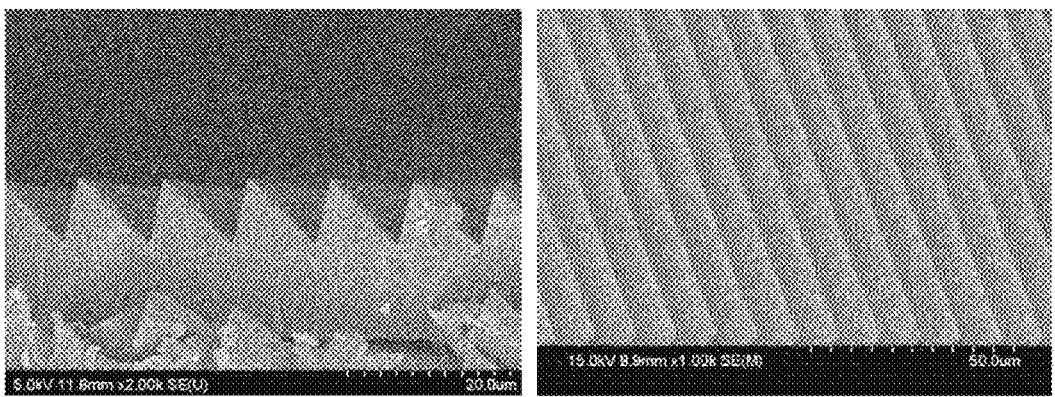

[FIG. 29]
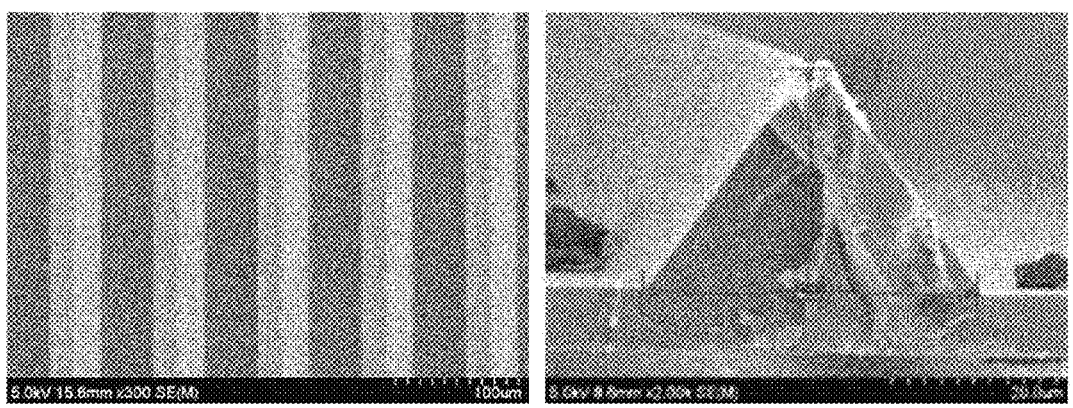
[FIG. 30]
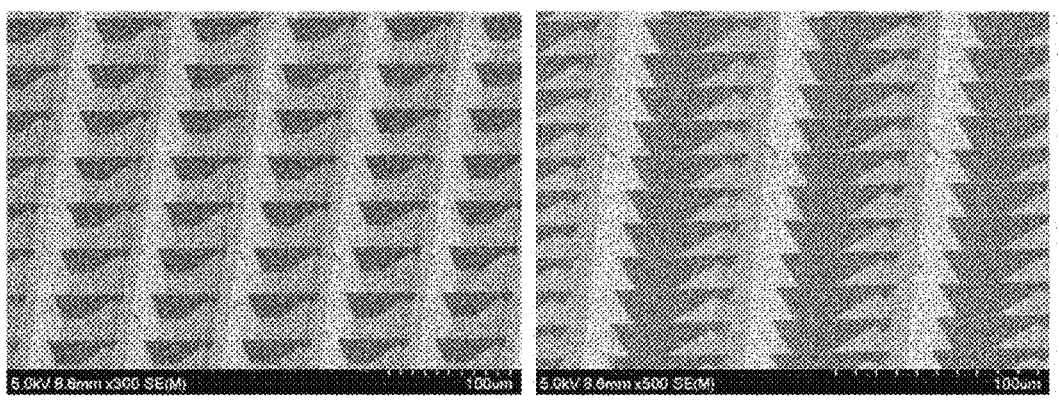

[FIG. 31]
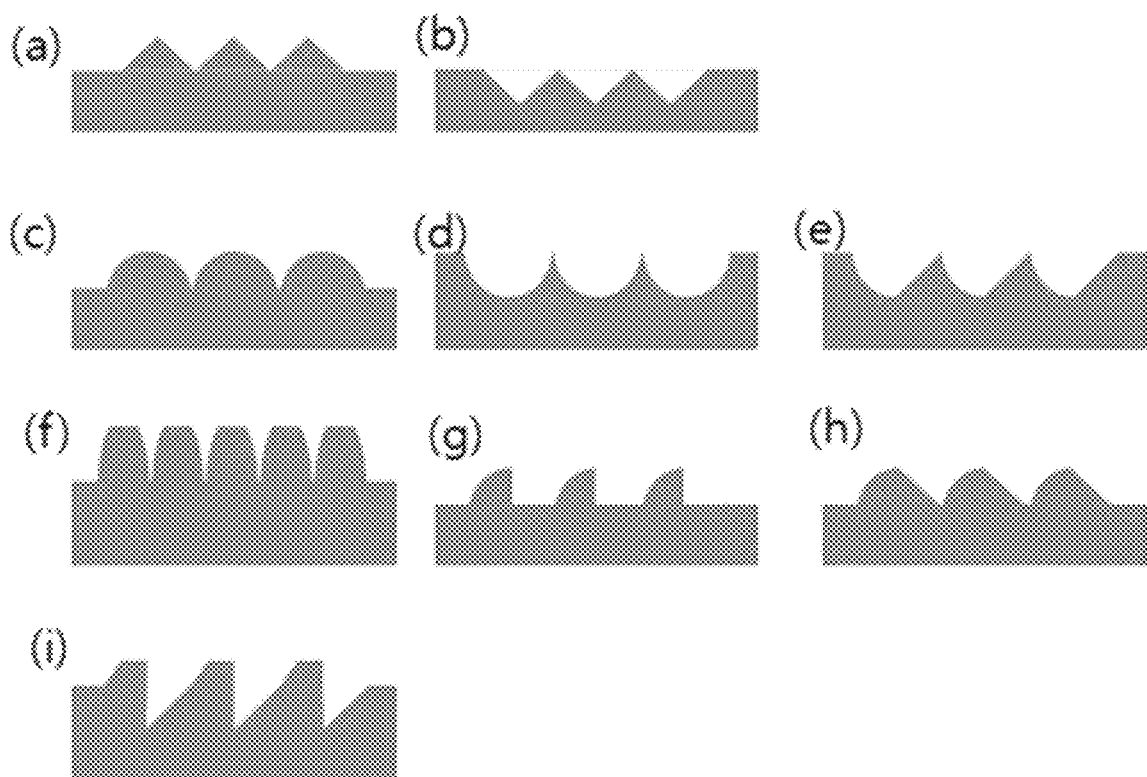

[FIG. 32]
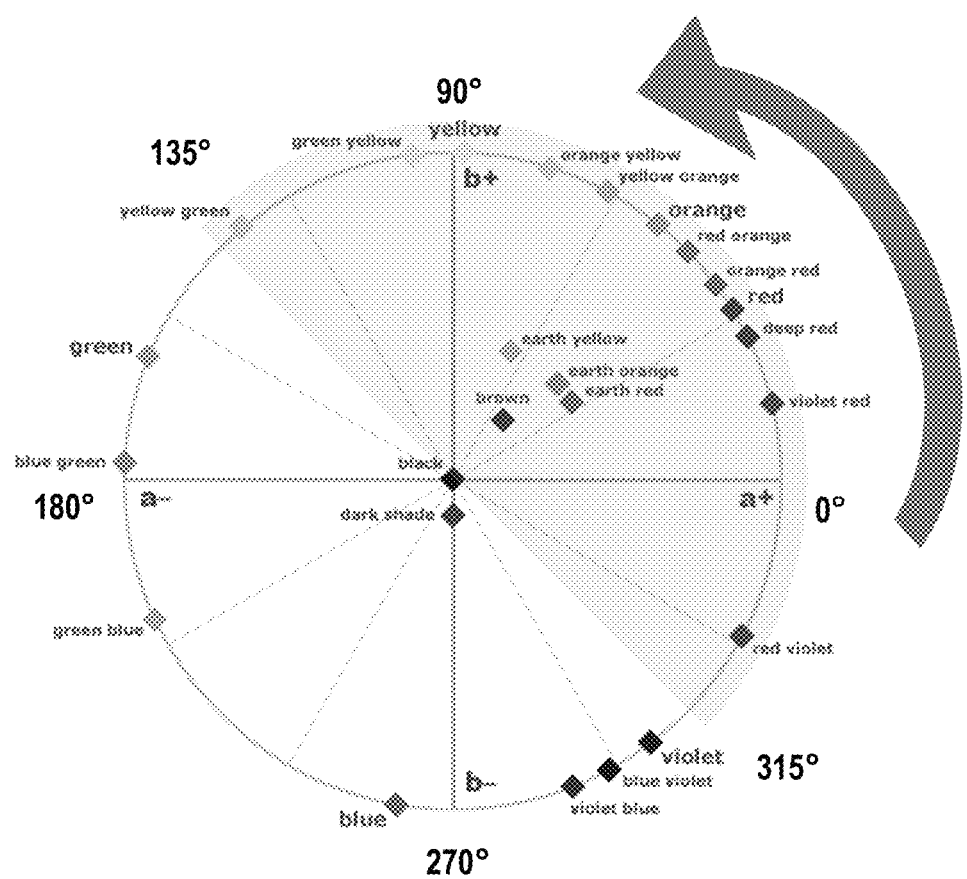

[FIG. 33]
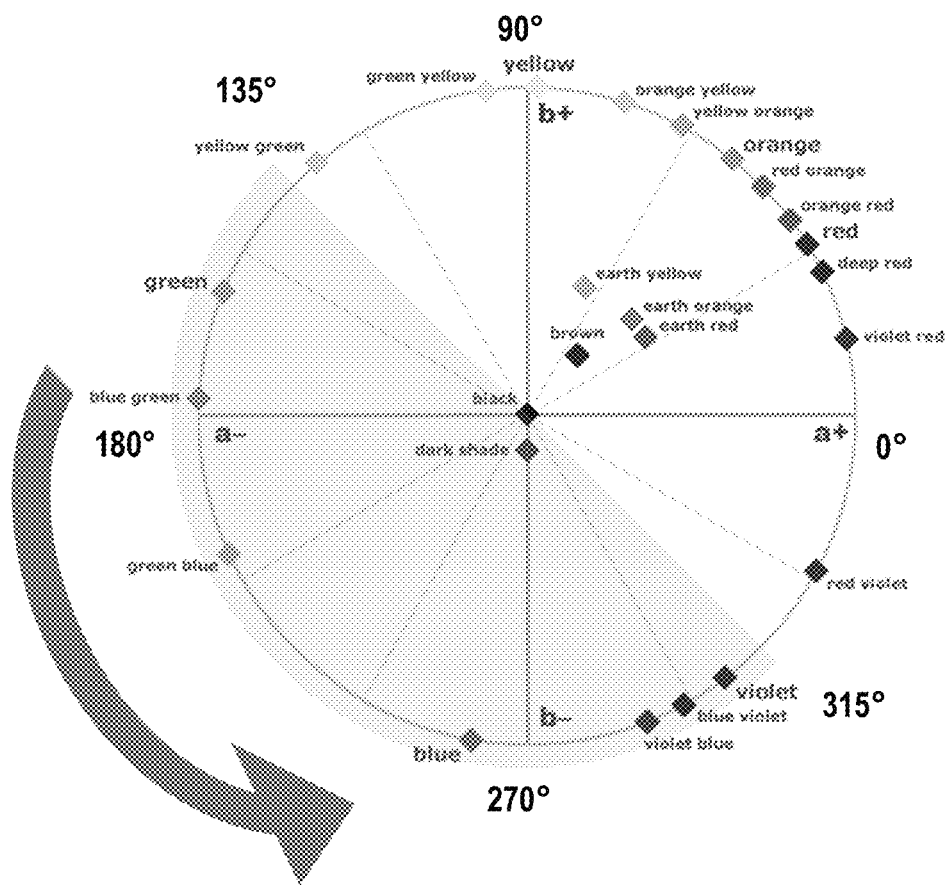
[FIG. 34]
| EXAMPLE(L*, c*, h*) | | | | COMPARATIVE EXAMPLE(L*, c*, h*) | | | |
|---|---|---|---|---|---|---|---|
| 1 | 2 | 3 | 4 | 1 | 2 | 3 | 4 |
| 68, 18, 70 | 52, 25, 72 | 38, 28, 59 | 29, 18, 350 | 31, 20, 255 | 39, 18, 267 | 47, 13, 250 | 52, 7, 20 |

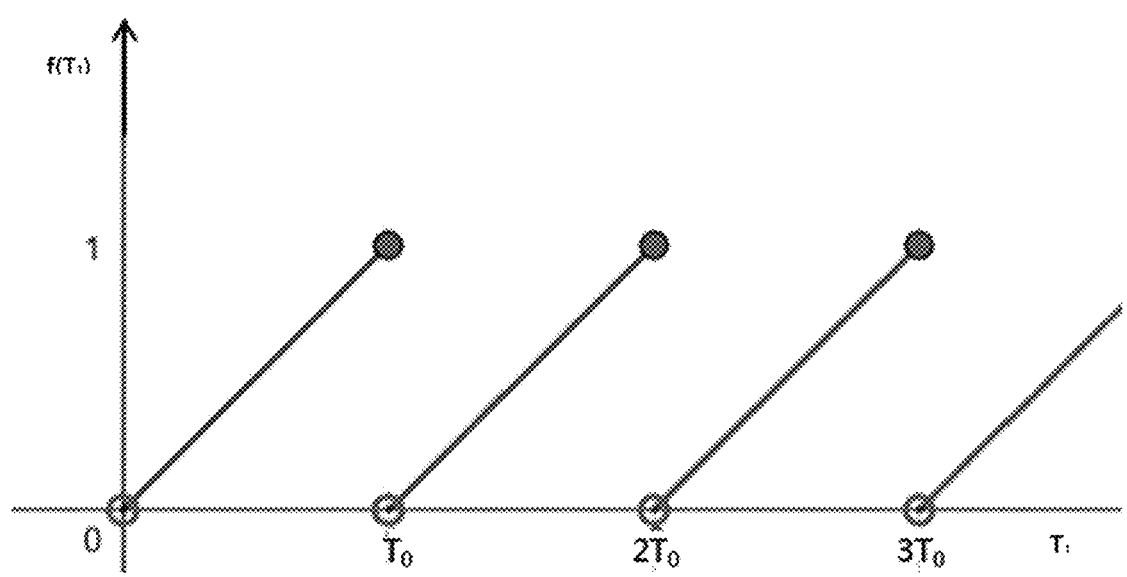
[FIG. 35]

DECORATION MEMBER

This application is a National Phase entry pursuant to 35 U.S.C. § 371 of International Application No. PCT/KR2019/007242 filed on Jun. 14, 2019, and claims priority to and the benefits of Korean Patent Application No. 10-2018-0069234, filed with the Korean Intellectual Property Office on Jun. 15, 2018, and Korean Patent Application No. 10-2018-0132115, filed with the Korean Intellectual Property Office on Oct. 31, 2018, the entire contents of which are incorporated herein by reference.

TECHNICAL FIELD

The present application relates to a decoration member.

BACKGROUND ART

For cosmetic containers, various mobile devices and electronic products, product designs such as colors, shapes and patterns play a major role in providing product values to customers in addition to product functions. Product preferences and prices are also dependent on designs.

As for cosmetic compact containers as one example, various colors and color senses are obtained using various methods and used in products. A method of providing colors to a case material itself and a method of providing designs by attaching a deco film implementing colors and shapes to a case material may be included.

In existing deco films, attempts have been made to develop colors through methods such as printing and deposition. When expressing heterogeneous colors on a single surface, printing needs to be conducted two or more times, and implementation is hardly realistic when to apply various colors to a three-dimensional pattern. In addition, existing deco films have fixed colors depending on a viewing angle, and even when there is a slight change, the change is limited to just a difference in the color sense.

PRIOR ART DOCUMENTS

Patent Documents

Patent Document 1: Korean Patent Application Laid-Open Publication No. 10-2010-0135837

DISCLOSURE

Technical Problem

The present application is directed to providing a decoration member.

Technical Solution

One embodiment of the present application provides a decoration member comprising a color developing layer comprising a light reflective layer and a light absorbing layer provided on the light reflective layer; and a substrate provided on one surface of the color developing layer, wherein the light absorbing layer comprises a molybdenum-titanium oxide ($Mo_aTi_bO_x$), and ω represented by the following Equation 1 is greater than or equal to 0.001 and less than or equal to 0.4 when conducting a component analysis on any one point of the light absorbing layer.

$$\omega = (T_x) \times (\sigma_x) \quad \text{[Equation 1]}$$

$$f(T_1) = \frac{T_1}{T_0} (0 < T_1 \leq T_0) \quad \text{[Equation 2]}$$

$$f(T_1) = f(T_1 + n \times T_0)$$

$$\sigma_x = \frac{a+b}{x} \quad \text{[Equation 3]}$$

In Equation 1, $T_x$ is a $T_1$-dependent function value of a function represented by $f(T_1)$, n is a positive integer of 1 or greater, and x is represented by Equation 3, in Equation 2, $T_1$ is a thickness of the light absorbing layer comprising the any one point of the light absorbing layer on which the component analysis is conducted, and $T_0$ is 80 nm, and in Equation 3, a means an element content ratio of molybdenum (Mo), b means an element content ratio of titanium (Ti), and x means an element content ratio of oxygen (O).

Advantageous Effects

A decoration member according to one embodiment of the present specification is capable of displaying warm tone colors by comprising a light absorbing layer comprising a molybdenum-titanium oxide and having each element content adjusted to a specific ratio.

The present application provides a decoration member having dichroism displaying different colors depending on a viewing direction and having improved visibility of the dichroism.

DESCRIPTION OF DRAWINGS

FIG. 1 illustrates a decoration member according to one embodiment of the present specification.

FIG. 2 presents a method of distinguishing a light absorbing layer and a light reflective layer.

FIG. 3 illustrates one point of a light absorbing layer and a thickness of the light absorbing layer comprising the same.

FIG. 4 describes a principle of light interference in a light absorbing layer and a light reflective layer.

FIG. 5 to FIG. 13 each illustrate a decoration member according to one embodiment of the present specification.

FIG. 14 to FIG. 31 illustrate shapes of a pattern layer.

FIG. 32 and FIG. 33 show a warm tone and a cool tone.

FIG. 34 shows results according to an evaluation example (evaluation of color).

FIG. 35 is a graph according to Equation 2.

MODE FOR DISCLOSURE

Hereinafter, the present specification will be described in detail.

In the present specification, "or" represents, unless defined otherwise, a case of selectively or all comprising those listed, that is, a meaning of "and/or".

In the present specification, a "layer" means covering 70% or more of an area where the corresponding layer is present. It means covering preferably 75% or more, and more preferably 80% or more.

In the present specification, a "thickness" of a certain layer means a shortest distance from a lower surface to an upper surface of the corresponding layer.

In the present specification, colors displayed by a decoration member may be defined by spectral characteristics of a light source, reflectance of an object, and color visual efficiency of an observer.

For objective color expression, colors need to be measured in a standard light source and a standard observer, and colors are expressed in a coordinate of color space. Colors of a decoration member may be displayed by a CIE Lab (L*a*b*) coordinate or a Lch coordinate providing visually uniform color space. L* represents brightness, +a* represents redness, −a* represents greenness, +b* represents yellowness and −b* represents blueness, and c* and h* will be described later. In the color space, a total color difference depending on an observation position may be expressed as $\Delta E \cdot ab = \sqrt{(\Delta L)^2 + (\Delta a)^2 + (\Delta b)^2}$.

The colors may be measured using a spectrophotometer (CM-2600d, manufactured by Konica Minolta, Inc.), and reflectance of a sample may be measured through a spectrophotometer and reflectance for each wavelength may be obtained, and from this, a spectral reflectance graph and a converted color coordinate may be obtained. Herein, data are obtained at an 8-degree viewing angle, and, in order to see dichroism of a decoration member, measurements are made in a horizontal direction and a vertical direction with respect to the decoration member.

The viewing angle is an angle formed by a straight line (d1) in a normal direction of a color developing layer surface of a decoration member and a straight line (d2) passing through the spectrophotometer and one point of the decoration member to measure, and generally has a range of 0 degrees to 90 degrees.

Having a viewing angle of 0 degrees means measuring in the same direction as a normal direction of a color developing layer surface of a decoration member.

In the present specification, a "light absorbing layer" and a "light reflective layer" are layers having properties relative to each other, and the light absorbing layer may mean a layer having higher light absorbance compared to the light reflective layer, and the light reflective layer may mean a layer having higher light reflectivity compared to the light absorbing layer.

The light absorbing layer and the light reflective layer may each be formed in a single layer, or in a multilayer of two or more layers.

In the present specification, the light absorbing layer and the light reflective layer are named by their functions. For light having a specific wavelength, a layer reflecting light relatively more may be expressed as the light reflective layer, and a layer reflecting light relatively less may be expressed as the light absorbing layer.

FIG. 1 illustrates a laminated structure of a decoration member according to one embodiment of the present specification. FIG. 1 illustrates a decoration member comprising a color developing layer (100) and a substrate (101). The color developing layer (100) comprises a light reflective layer (201) and a light absorbing layer (301). FIG. 1 illustrates a structure in which the substrate (101) is provided on the light absorbing layer (301) side of the color developing layer (100), however, the substrate may also be provided on the light reflective layer (201) side.

Through FIG. 2, the light absorbing layer and the light reflective layer are described. In the decoration member of FIG. 2, each layer is laminated in order of a $L_{i+1}$ layer, a $L_1$ layer and a $L_{i+1}$ layer based on a light entering direction, an interface $I_i$ is located between the $L_{i+1}$ layer and the $L_i$ layer, and an interface $I_{i+1}$ is located between the $L_1$ layer and the $L_{i+1}$ layer.

When irradiating light having a specific wavelength in a direction perpendicular to each layer so that thin film interference does not occur, reflectance at the interface $I_i$ may be expressed by the following Mathematical Equation 1.

$$\frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \quad \text{[Mathematical Equation 1]}$$

In Mathematical Equation 1, $n_i(\lambda)$ means a refractive index depending on the wavelength ($\lambda$) of the $i^{th}$ layer, and $k_i(\lambda)$ means an extinction coefficient depending on the wavelength ($\lambda$) of the $i^{th}$ layer. The extinction coefficient is a measure capable of defining how strongly a subject material absorbs light at a specific wavelength, and the definition is the same as a definition to provide later.

Using Mathematical Equation 1, when a sum of reflectance for each wavelength at the interface $I_i$ calculated at each wavelength is $R_i$, $R_i$ is as in the following Mathematical Equation 2.

$$R_i = \frac{\sum_{\lambda=380\,nm}^{\lambda=780\,nm} \frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \Delta\lambda}{\sum_{\lambda=380\,nm}^{\lambda=t80\,nm} \Delta\lambda} \quad \text{[Mathematical Equation 2]}$$

Hereinafter, a decoration member comprising the light reflective layer and the light absorbing layer described above will be described.

One embodiment of the present application provides a decoration member comprising a color developing layer comprising a light reflective layer and a light absorbing layer provided on the light reflective layer; and a substrate provided on one surface of the color developing layer, wherein the light absorbing layer comprises a molybdenum-titanium oxide ($Mo_aTi_bO_x$), and ω represented by the following Equation 1 is greater than or equal to 0.001 and less than or equal to 0.4 when conducting a component analysis on any one point of the light absorbing layer.

$$\omega = (T_x) \times (\sigma_x) \quad \text{[Equation 1]}$$

$$f(T_1) = \frac{T_1}{T_0} (0 < T_1 \le T_0) \quad \text{[Equation 2]}$$

$$f(T_1) = f(T_1 + n \times T_0)$$

$$\sigma_x = \frac{a+b}{x} \quad \text{[Equation 3]}$$

In Equation 1, $T_x$ is a $T_1$-dependent function value of a function represented by $f(T_1)$, n is a positive integer of 1 or greater, and ax is represented by Equation 3, in Equation 2, $T_1$ is a thickness of the light absorbing layer comprising the any one point of the light absorbing layer on which the component analysis is conducted, and $T_0$ is 80 nm, and in Equation 3, a means an element content ratio of molybdenum (Mo), b means an element content ratio of titanium (Ti), and x means an element content ratio of oxygen (O). For example, when the content of the molybdenum (Mo), the content of the titanium (Ti) and the content of the oxygen (O) at the one point are 57.5%, 9.8% and 39.7%, respectively, a, b and c may each be expressed as 0.575, 0.098 and 0.397.

In the present specification, the content ratio of a specific element may mean an atomic percent (at %) of a specific element at any one point of the light absorbing layer on which the component analysis is conducted.

In the decoration member according to one embodiment of the present specification, warm colors (warm tone) may be observed through the light absorbing layer by the light absorbing layer comprising a molybdenum-titanium oxide ($Mo_aTi_bO_x$), adjusting a content ratio of each element of the molybdenum-titanium oxide, and adjusting a thickness of the light absorbing layer to a specific range. Herein, the relation between the content ratio of each element of the molybdenum-titanium oxide and the thickness of the light absorbing layer may be expressed as ω, a warm tone parameter, represented by Equation 1. The warm tone parameter may be expressed as $ω_w$. The subscript w of $ω_w$ means a warm tone.

In one embodiment of the present specification, ω represented by Equation 1 with respect to any one point (x) of the light absorbing layer may be greater than or equal to 0.01 and less than or equal to 0.39, greater than or equal to 0.05 and less than or equal to 0.37, greater than or equal to 0.1 and less than or equal to 0.31, or greater than or equal to 0.1 and less than or equal to 0.35. When satisfying the above-mentioned numerical range, warm colors (warm tone) may be observed through the light absorbing layer, and among the warm colors, a color that a user wants may be readily displayed.

In the present specification, the 'any one point of the light absorbing layer' may mean any one point on a surface of or inside the light absorbing layer.

In one embodiment of the present specification, $T_x$ is a thickness parameter represented by Equation 2. As the light absorbing layer thickness changes, warm colors (warm tone) or cool colors (cool tone) appear alternately, and color changes appear with the thickness having a constant period ($T_0$). Herein, Tx may mean a ratio of the light absorbing layer thickness ($T_1$) at any one point with respect to the constant period ($T_0$) of the light absorbing layer thickness. For example, when the constant period of the thickness is 80 nm, the Tx value when the light absorbing layer has a thickness of 10 nm, 90 nm and 170 nm is the same as 0.125.

In Equation 2, $T_1$ is a thickness of the light absorbing layer comprising any one point of the light absorbing layer. $T_1$ means, when selecting any one point of the light absorbing layer, a thickness of the light absorbing layer comprising the one point. When observing a cross-section of the decoration member through a scanning electron microscope (SEM) and the like, an interface may be identified between the light reflective layer and the light absorbing layer, and it may be identified that a layer comprising a molybdenum-titanium oxide is the light absorbing layer through a component analysis. Herein, any one point of the light absorbing layer is selected, and a thickness of the light absorbing layer comprising the any one point may be calculated to be used as $T_1$.

Equation 2 represents a periodic function $f(T_1)$ depending on a thickness ($T_1$) of the light absorbing layer. It means having the same $f(T_1)$ value depending on a period $T_0$. This is shown in FIG. 35. According to FIG. 35, $f(T_1)$ appearing in a range of ($0<T_1 \leq T_0$) repeatedly appears having a constant period ($T_0$). For example, $f(0.5\ T_0)$ when $T_1=0.5\ T_0$ and $f(1.5\ T_0)$ when $T_1=0.5\ T_0+T_0$ have the same value of 0.5.

In one embodiment of the present specification, a, b and x are the same as or different from each other, and may each have a value of greater than 0 and less than 1.

In one embodiment of the present specification, a+b+x may be 1.

The thickness $T_1$ may mean, in a cross-section in a direction perpendicular to a surface direction of the light absorbing layer while comprising any one point of the light absorbing layer, a length in the thickness direction of the light absorbing layer.

FIG. 3 presents a method of determining one point and a thickness of the light absorbing layer. When selecting any one point (red dot of FIG. 3) of the light absorbing layer, a content ratio parameter represented by Equation 3 is calculated through a component analysis on this point, and a width of a line segment perpendicular to a surface direction of the light absorbing layer among line segments passing through this point is calculated to calculate the thickness ($T_1$).

In addition, $T_1$ may be achieved by controlling a process pressure used in deposition when forming the light absorbing layer, a flow rate of a reactive gas with respect to a plasma gas, a voltage, a deposition time or a temperature.

In the decoration member of the present disclosure, a cool tone or a warm tone repeatedly appears with a constant period depending on changes in the thickness of the light absorbing layer. Herein, To may be expressed as a "period of a light absorbing layer thickness in which a warm tone repeatedly appears".

The component analysis of the light absorbing layer may use a transmission X-ray component analysis. Specifically, the transmission X-ray component analysis may be X-ray photoelectron spectroscopy (XPS).

In Equation 3, a means an element content ratio of molybdenum (Mo), b means an element content ratio of titanium (Ti), and x means an element content ratio of oxygen (O). The element content ratio of each element of the light absorbing layer may be measured using methods generally used in the art, and X-ray photoelectron spectroscopy (XPS) or electron spectroscopy for chemical analysis (ESCA, Thermo Fisher Scientific Inc.) may be used.

In one embodiment of the present specification, the thickness parameter Tx may be greater than or equal to 0.01 and less than or equal to 0.5, preferably greater than or equal to 0.1 and less than or equal to 0.5, and more preferably greater than or equal to 0.125 and less than or equal to 0.5. When satisfying the above-mentioned numerical range, warm colors (warm tone) may be more clearly observed in the decoration member.

In one embodiment of the present specification, the content ratio parameter ax may be greater than or equal to 0.1 and less than or equal to 1.2, preferably greater than or equal to 0.4 and less than or equal to 0.9, and more preferably greater than or equal to 0.5 and less than or equal to 0.8. When satisfying the above-mentioned numerical range, warm colors (warm tone) may be more clearly observed in the decoration member. The ratio between these elements may be achieved by adjusting a gas fraction when depositing the molybdenum-titanium oxide.

Specifically, after performing qualitative analyses by conducting a survey scan in light absorbing layer surface and thickness directions using X-ray photoelectron spectroscopy (XPS) or electron spectroscopy for chemical analysis (ESCA, Thermo Fisher Scientific Inc.), a quantitative analysis is performed with a narrow scan. Herein, the qualitative analysis and the quantitative analysis are performed by obtaining the survey scan and the narrow scan under the condition of the following Table 1. Peak background uses a smart method.

TABLE 1

| Element | Scan Section Binding Energy | Step Size |
|---|---|---|
| Narrow (Snapshot) | 20.89 eV | 0.1 eV |
| Survey | −10 eV to 1350 eV | 1 eV |

In addition, the component analysis may be conducted by preparing a light absorbing layer slice having the same composition as the light absorbing layer before laminating the decoration member. Alternatively, when the decoration member has a structure of substrate/pattern layer/light reflective layer/light absorbing layer, an outermost edge of the decoration member may be analyzed using the method described above. In addition, the light absorbing layer may be visually identified by observing a photograph of a cross-section of the decoration member. For example, when the decoration member has a structure of substrate/pattern layer/light reflective layer/light absorbing layer, the presence of an interface between each layer is identified in a photograph of a cross-section of the decoration member, and an outermost layer corresponds to the light absorbing layer.

In one embodiment of the present specification, a hue-angle h* in CIE Lch color space of the light absorbing layer may be in a range of 315° to 360° and 0° to 150°, a range of 320° to 360° and 0° to 105°, or a range of 320° to 360° and 0° to 100°.

When the Hue-angle h* is in the above-mentioned range, a warm tone may be observed from the decoration member. A warm tone means satisfying the above-mentioned numerical range in CIE Lch color space. Colors corresponding to a warm tone are shown in FIG. 32 and colors corresponding to a cool tone are shown in FIG. 33.

In one embodiment of the present specification, the light absorbing layer may have L* of 0 to 100 or 30 to 100 in CIE Lch color space.

In one embodiment of the present specification, the light absorbing layer may have c* of 0 to 100, 1 to 80 or 1 to 60 in CIE Lch color space.

In the present specification, the CIE Lch color space is CIE Lab color space, and herein, cylinder coordinates c* (chroma, relative color saturation), L* (distance from L axis), and h* (hue-angle, hue-angle in CIE Lab hue circle) are used instead of a* and b* of Cartesian coordinates.

In one embodiment of the present specification, the light absorbing layer preferably has a refractive index (n) of 0 to 8 at a wavelength of 400 nm, and the refractive index may be from 0 to 7, may be from 0.01 to 3, and may be from 2 to 2.5. The refractive index (n) may be calculated by sin θa/sin θb (θa is an angle of light entering a surface of the light absorbing layer, and b is a refraction angle of light inside the light absorbing layer).

In one embodiment of the present specification, the light absorbing layer preferably has a refractive index (n) of 0 to 8 in a wavelength range of 380 nm to 780 nm, and the refractive index may be from 0 to 7, may be from 0.01 to 3, and may be from 2 to 2.5.

In one embodiment of the present specification, the light absorbing layer has an extinction coefficient (k) of greater than 0 and less than or equal to 4 at a wavelength of 400 nm, and the extinction coefficient is preferably from 0.01 to 4, may be from 0.01 to 3.5, may be from 0.01 to 3, and may be from 0.1 to 1. The extinction coefficient (k) is $-\lambda/4\pi I$ (dI/dx) (herein, a value multiplying $\lambda/4\pi$ with dI/I, a reduced fraction of light intensity per a path unit length (dx), for example 1 m, in the light absorbing layer, and herein, k is a wavelength of light).

In one embodiment of the present specification, the light absorbing layer has an extinction coefficient (k) of greater than 0 and less than or equal to 4 in a wavelength range of 380 nm to 780 nm, and the extinction coefficient is preferably from 0.01 to 4, may be from 0.01 to 3.5, may be from 0.01 to 3, and may be from 0.1 to 1. The extinction coefficient (k) is in the above-mentioned range at 400 nm, or preferably in the whole visible wavelength region of 380 nm to 780 nm, and therefore, a role of the light absorbing layer may be performed in the visible range.

A principle of a light absorbing layer having specific extinction coefficient and refractive index developing colors as above and a principle of color development of a decoration member developing colors by adding a dye to an existing substrate are different. For example, using a method of absorbing light by adding a dye to a resin, and using a material having an extinction coefficient as described above lead to different light absorption spectra. When absorbing light by adding a dye to a resin, an absorption wavelength band is fixed, and only a phenomenon of varying an absorption amount depending on the changes in the coating thickness occurs. In addition, in order to obtain a target light absorption amount, changes in the thickness of at least a few micrometers or more are required to adjust the light absorption amount. On the other hand, in materials having an extinction coefficient, a wavelength band absorbing light changes even when the thickness changes by a several to tens of nanometer scale.

In addition, when adding a dye to an existing resin, only specific colors by the dye are developed, and therefore, various colors may not be displayed. On the other hand, by the light absorbing layer of the present disclosure using a specific material instead of a resin, an advantage of displaying various colors is obtained by an interference phenomenon of light without adding a dye.

According to the embodiments, light absorption occurs in an entering path and a reflection path of light in the light absorbing layer, and by the light reflecting on each of a surface of the light absorbing layer and an interface of the light absorbing layer (301) and the light reflective layer (201), the two reflected lights go through constructive or destructive interference.

In the present specification, the light reflected on the surface of the light absorbing layer may be expressed as surface reflected light, and the light reflected on the interface of the light absorbing layer and the light reflective layer may be expressed as interface reflected light. A mimetic diagram of such a working principle is illustrated in FIG. 4. FIG. 4 illustrates a structure in which a substrate (101) is provided on the light reflective layer (201) side, however, the structure is not limited to such a structure, and the substrate (101) may be disposed on other locations.

In one embodiment of the present specification, the light absorbing layer may be a single layer, or a multilayer of two or more layers.

In one embodiment of the present specification, the light absorbing layer may further comprise one, two or more selected from the group consisting of metals, metalloids, and oxides, nitrides, oxynitrides and carbides of metals or metalloids. The oxides, nitrides, oxynitrides or carbides of metals or metalloids may be formed under a deposition condition and the like set by those skilled in the art. The light absorbing layer may also comprise the same metals, metalloids, alloys or oxynitrides of two or more types as the light reflective layer.

In one embodiment of the present specification, the thickness ($T_1$) of the light absorbing layer may be determined depending on target colors in a final structure, and for example, may be greater than or equal to 1 nm and less than or equal to 300 nm, greater than or equal to 1 nm and less than or equal to 40 nm, greater than or equal to 81 nm and less than or equal to 120 nm, or greater than or equal to 161 nm and less than or equal to 200 nm.

In one embodiment of the present specification, the light reflective layer is not particularly limited as long as it is a material capable of reflecting light, however, light reflectance may be determined depending on the material, and for example, colors are readily obtained at 50% or greater of light reflectance. Light reflectance may be measured using an ellipsometer.

In one embodiment of the present specification, the light reflective layer may be a metal layer, a metal oxide layer, a metal nitride layer, a metal oxynitride layer or an inorganic material layer. The light reflective layer may be formed in a single layer, or may also be formed in a multilayer of two or more layers.

In one embodiment of the present specification, the light reflective layer may be a single layer or a multilayer comprising one, two or more types of materials selected from the group consisting of one, two or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag); oxides thereof; nitrides thereof; oxynitrides thereof; carbon; and carbon composites.

In one embodiment of the present specification, the light reflective layer may comprise alloys of two or more selected from among the above-mentioned materials, or oxides, nitrides or oxynitrides thereof.

In one embodiment of the present specification, the light reflective layer may allow highly resistant reflective layer by being prepared using an ink comprising carbon or carbon composites. Carbon black, CNT and the like may be included as the carbon or carbon composites.

In one embodiment of the present specification, the ink comprising carbon or carbon composites may comprise above-described materials, or oxides, nitrides or oxynitrides thereof, and for example, oxides of one, two or more types selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag) may be included. A curing process may be further performed after printing the ink comprising carbon or carbon composites.

In one embodiment of the present specification, when the light reflective layer comprises two or more types of materials, the two or more types of materials may be formed using one process, for example, a method of deposition or printing, however, a method of first forming a layer using one or more types of materials, and then additionally forming a layer thereon using one or more types of materials may be used. For example, a light reflective layer may be formed by forming a layer through depositing indium or tin, then printing an ink comprising carbon, and then curing the result. The ink may further comprise an oxide such as titanium oxide or silicon oxide.

In one embodiment of the present specification, the thickness of the light reflective layer may be determined depending on target colors in a final structure, and for example, may be greater than or equal to 1 nm and less than or equal to 100 nm, greater than or equal to 10 nm and less than or equal to 90 nm, or greater than or equal to 30 nm and less than or equal to 90 nm.

(Light Absorbing Layer Structure)

In one embodiment of the present specification, the light absorbing layer may have various shapes by adjusting a deposition condition and the like when forming the light absorbing layer.

In one embodiment of the present specification, the light absorbing layer comprises two or more points with different thicknesses.

In one embodiment of the present specification, the light absorbing layer comprises two or more regions with different thicknesses.

In one embodiment of the present specification, the light absorbing layer may comprise an inclined surface.

Examples of the structure according to the embodiment are illustrated in FIG. 5 and FIG. 6. FIG. 5 and FIG. 6 illustrate a structure in which a light reflective layer (201) and a light absorbing layer (301) are laminated (substrate not included). According to FIG. 5 and FIG. 6, the light absorbing layer (301) has two or more points with different thicknesses. According to FIG. 5, thicknesses in A point and B point are different in the light absorbing layer (301). According to FIG. 6, thicknesses in C region and D region are different in the light absorbing layer (301).

In one embodiment of the present specification, the light absorbing layer comprises one or more regions in which an upper surface has an inclined surface with an inclined angle of greater than 0 degrees and less than or equal to 90 degrees, and the light absorbing layer comprises one or more regions having a thickness different from a thickness in the any one region having an inclined surface. As for the inclined surface, an angle formed by any one straight line included in an upper surface of the light absorbing layer and a straight line parallel to the light reflective layer may be defined as the inclined surface. For example, an inclined angle of an upper surface of the light absorbing layer of FIG. 5 may be approximately 20 degrees.

Surface properties such as an upper surface slope of the light reflective layer may be the same as an upper surface of the light absorbing layer. For example, by using a deposition method when forming the light absorbing layer, the upper surface of the light absorbing layer may have the same slope as the upper surface of the light reflective layer. However, the upper surface slope of the light absorbing layer of FIG. 5 is different from the upper surface slope of the light reflective layer.

FIG. 7 illustrates a structure of a decoration member having a light absorbing layer in which an upper surface has an inclined surface. The structure is a structure laminating a substrate (101), a light reflective layer (201) and a light absorbing layer (301), and thickness t1 in E region and thickness t2 in F region are different in the light absorbing layer (301). Reference numeral 401 may be a color film.

FIG. 7 relates to a light absorbing layer having inclined surfaces facing each other, that is, having a structure with a triangle cross-section. In the structure of a pattern having inclined surfaces facing each other as in FIG. 7, a thickness of the light absorbing layer may be different in two surfaces having the triangle structure even when progressing deposition under the same condition. Accordingly, a light absorbing layer having two or more regions with different thicknesses may be formed using just one process. As a result, developed colors may become different depending on the thickness of the light absorbing layer. Herein, the thickness of the light reflective layer does not affect changes in the color when it is a certain thickness or greater.

FIG. 7 illustrates a structure in which a substrate (101) is provided on a light reflective layer (201) side, however, the structure is not limited thereto, and as described above, the substrate (101) may also be disposed on other locations.

In addition, in FIG. 7, the surface adjoining the light reflective layer (201) of the substrate (101) is a flat surface, however, the surface adjoining the light reflective layer (201) of the substrate (101) may have a pattern having the same slope as an upper surface of the light reflective layer (201). This is illustrated in FIG. 8. This may cause a difference in the thickness of the light absorbing layer as well due to a difference in the slope of the pattern of the substrate. However, the present disclosure is not limited thereto, and even when the substrate and the light absorbing layer are prepared to have different slopes using different deposition methods, the dichroism described above may be obtained by having the thickness of the light absorbing layer being different on both sides of the pattern.

In one embodiment of the present specification, the light absorbing layer comprises one or more regions with a gradually changing thickness. FIG. 9 illustrates a structure in which a thickness of the light absorbing layer (301) gradually changes.

In one embodiment of the present specification, the light absorbing layer comprises one or more regions in which an upper surface has an inclined surface with an inclined angle of greater than 0 degrees and less than or equal to 90 degrees, and at least one or more of the regions having an inclined surface have a structure in which a thickness of the light absorbing layer gradually changes. FIG. 9 illustrates a structure of a light absorbing layer comprising a region in which an upper surface has an inclined surface. In FIG. 9, both G region and H region have a structure in which an upper surface of the light absorbing layer has an inclined surface, and a thickness of the light absorbing layer gradually changes.

In the present specification, the structure in which a thickness of the light absorbing layer changes means that a cross-section in a thickness direction of the light absorbing layer comprises a point at which the light absorbing layer has a smallest thickness and a point at which the light absorbing layer has a largest thickness, and the thickness of the light absorbing layer increases along the direction of the point at which the light absorbing layer has a smallest thickness with respect to the point at which the light absorbing layer has a largest thickness. Herein, the point at which the light absorbing layer has a smallest thickness and the point at which the light absorbing layer has a largest thickness may mean any point on the interface of the light absorbing layer with the light reflective layer.

In one embodiment of the present specification, the light absorbing layer comprises a first region having a first inclined surface with an inclined angle in a range of 1 degree to 90 degrees, and may further comprise two or more regions in which an upper surface has an inclined surface with a different slope direction or a different inclined angle from the first inclined surface, or an upper surface is horizontal. Herein, thicknesses in the first region and the two or more regions may all be different from each other in the light absorbing layer.

(Substrate)

In one embodiment of the present specification, the decoration member comprises a substrate provided on one surface of the color developing layer.

In one embodiment of the present specification, the decoration member comprises a substrate (101) provided on any one or more of a surface facing the light absorbing layer (301) of the light reflective layer (201); or a surface facing the light reflective layer of the light absorbing layer. For example, the substrate may be provided on a surface opposite to the surface facing the light absorbing layer of the light reflective layer (FIG. 10(a)); or a surface opposite to the surface facing the light reflective layer of the light absorbing layer (FIG. 10(b)).

In one embodiment of the present specification, the substrate may comprise a plastic injection mold or a glass substrate for a cosmetic container. More specifically, the plastic injection mold may comprise one or more types of polypropylene (PP), polystyrene (PS), polyvinyl acetate (PVAc), polyacrylate, polyethylene terephthalate (PET), polyvinyl chloride (PVC), polymethyl methacrylate (PMMA), an ethylene-vinyl acetate copolymer (EVA), polycarbonate (PC), polyamide and a styrene-acrylonitrile copolymer (SAN), but is not limited thereto.

In addition, the plastic injection mold may be a plate-type plastic injection mold without curves (specific pattern), or may be a plastic injection mold having curves (specific pattern).

The plastic injection mold may be prepared using a plastic molding method. The plastic molding method comprises compression molding, injection molding, air blow molding, thermoforming, hotmelt molding, foaming molding, roll molding, reinforced plastic molding and the like. The compression molding is a molding method of placing a material into a mold, heating the result, and applying a pressure thereto, and, as the oldest molding method, this may be mainly used in molding thermo-curable resins such as phenol resins. The injection molding is a molding method of pushing out a plastic melt using a transporting device, and filling a mold therewith through a nozzle, and this method may mold both thermoplastic resins and thermo-curable resins, and is a molding method used the most. The resin used as a cosmetic case is SAN. The air blow molding is a method of molding a product while placing a plastic parison in the center of a mold and injecting air thereto, and, as a molding method of making plastic bottles or small containers, the speed of manufacturing a product is very fast.

In one embodiment of the present specification, glass having transmittance of 80% or greater may be used as the glass substrate.

In one embodiment of the present specification, the substrate thickness may be selected as needed, and for example, may have a range of 50 μm to 200 μm.

In one embodiment of the present specification, the decoration member may be prepared using a step of forming a light reflective layer on the substrate and forming a light absorbing layer provided on the light reflective layer. More specifically, in the decoration member, the light absorbing layer and the light reflective layer may be consecutively formed on the substrate using a deposition process or the like, or the light reflective layer and the light absorbing layer may be consecutively formed on the substrate using a deposition process or the like, however, the method is not limited thereto.

(Color Film)

In one embodiment of the present specification, the color developing layer further comprises a color film.

In one embodiment of the present specification, the decoration member further comprises a color film on a surface opposite to the surface facing the light reflective layer of the light absorbing layer; between the light absorbing layer and the light reflective layer; or on a surface opposite to the surface facing the light absorbing layer of the light reflective layer. The color film may also perform a role of a substrate. For example, those that may be used as a substrate may be used as a color film by adding a dye or a pigment thereto.

In one embodiment of the present specification, the color film is not particularly limited as long as it has a color difference ΔE*ab, a distance in space of L*a*b* in a color coordinate CIE L*a*b* of the color developing layer, of greater than 1 when the color film is present compared to when the color film is not provided.

Colors may be expressed by CIE L*a*b*, and a color difference may be defined using a distance (ΔE*ab) in L*a*b* space. Specifically, the color difference is $\Delta E \cdot ab = \sqrt{(\Delta L)^2 + (\Delta a)^2 + (\Delta b)^2}$, and within a range of 0<ΔE*ab<1, an observer may not recognize the color difference [reference document: Machine Graphics and Vision 20(4):383-411]. Accordingly, a color difference obtained by the color film addition may be defined by ΔE*ab>1 in the present specification.

FIG. 11 illustrates a color developing layer comprising a color film, and FIG. 11(a) illustrates a structure in which a light reflective layer (201), a light absorbing layer (301) and a color film (401) are consecutively laminated, FIG. 11(b) illustrates a structure in which a light reflective layer (201), a color film (401) and a light absorbing layer (301) are consecutively laminated, and FIG. 11(c) illustrates a structure in which a color film (401), a light reflective layer (201) and a light absorbing layer (301) are consecutively laminated.

In one embodiment of the present specification, when the substrate is provided on a surface opposite to the surface facing the light absorbing layer of the light reflective layer, and the color film is located on a surface opposite to the surface facing the light absorbing layer of the light reflective layer, the color film may be provided between the substrate and the light reflective layer; or on a surface opposite to the surface facing the light reflective layer of the substrate. As another example, when the substrate is provided on a surface opposite to the surface facing the light reflective layer of the light absorbing layer, and the color film is located on a surface opposite to the surface facing the light reflective layer of the light absorbing layer, the color film may be provided between the substrate and the light absorbing layer; or on a surface opposite to the surface facing the light absorbing layer of the substrate.

In one embodiment of the present specification, the substrate is provided on a surface opposite to the surface facing the light absorbing layer of the light reflective layer, and the color film is further provided. FIG. 12(a) illustrates a structure in which the color film (401) is provided on a surface opposite to the light reflective layer (201) side of the light absorbing layer (301), FIG. 12(b) illustrates a structure in which the color film (401) is provided between the light absorbing layer (301) and the light reflective layer (201), FIG. 12(c) illustrates a structure in which the color film (401) is provided between the light reflective layer (201) and the substrate (101), and FIG. 12(d) illustrates a structure in which the color film (401) is provided on a surface opposite to the light reflective layer (201) side of the substrate (101). FIG. 12(e) illustrates a structure in which the color films (401a, 401b, 401c, 401d) are provided on a surface opposite to the light reflective layer (201) side of the light absorbing layer (301), between the light absorbing layer (301) and the light reflective layer (201), between the light reflective layer (201) and the substrate (101), and on a surface opposite to the light reflective layer (201) side of the substrate (101), respectively, however, the structure is not limited thereto, and 1 to 3 of the color films (401a, 401b, 401c, 401d) may not be included.

In one embodiment of the present specification, the substrate is provided on a surface opposite to the surface facing the light reflective layer of the light absorbing layer, and the color film is further provided. FIG. 13(a) illustrates a structure in which the color film (401) is provided on a surface opposite to the light absorbing layer (301) side of the substrate (101), FIG. 13(b) illustrates a structure in which the color film (401) is provided between the substrate (101) and the light absorbing layer (301), FIG. 13(c) illustrates a structure in which the color film (401) is provided between the light absorbing layer (301) and the light reflective layer (201), and FIG. 13(d) illustrates a structure in which the color film (401) is provided on a surface opposite to the light absorbing layer (301) side of the light reflective layer (201). FIG. 13(e) illustrates a structure in which the color films (401a, 401b, 401c, 401d) are provided on a surface opposite to the light absorbing layer (201) side of the substrate (101), between the substrate (101) and the light absorbing layer (301), between the light absorbing layer (301) and the light reflective layer (201), and on a surface opposite to the light absorbing layer (201) side of the light reflective layer (201), respectively, however, the structure is not limited thereto, and 1 to 3 of the color films (401a, 401b, 401c, 401d) may not be included.

In the structures such as FIG. 12(b) and FIG. 13(c), the light reflective layer may reflect light entering through the color film when the color film has visible light transmittance of greater than 0%, and therefore, colors may be obtained by laminating the light absorbing layer and the light reflective layer.

In the structures such as FIG. 12(c), FIG. 12(d) and FIG. 13(d), light transmittance of the colors developed from the color film of the light reflective layer (201) may be 1% or greater, preferably 3% or greater and more preferably 5% or greater so that changes in the color difference obtained by the color film addition is recognized. This is due to the fact that light transmitted in such a visible light transmittance range may be mixed with colors obtained by the color film.

In one embodiment of the present specification, the color film may be provided as one sheet, or as a laminate of 2 sheets or more that are the same or different types.

As the color film, those capable of developing target colors by being combined with colors developed from the laminated structure of the light reflective layer and the light absorbing layer described above may be used. For example, color films expressing colors by dispersing one, two or more types of pigments and dyes into a matrix resin may be used. Such a color film may be formed by directly coating a composition for forming a color film on a color film-providable location, or a method of preparing a color film by coating a composition for forming a color film on a separate substrate or using a known molding method such as casting or extrusion, and then disposing or attaching the color film on a color film-providable location may be used. As the coating method, wet coating or dry coating may be used.

The pigment and the dye capable of being included in the color film may be selected from among those known in the art and capable of obtaining target colors from a final decoration member, and one, two or more types among pigments and dyes of red-based, yellow-based, purple-based, blue-based, pink-based and the like may be used. Specifically, dyes such as perinone-based red dyes, anthraquinone-based red dyes, methane-based yellow dyes, anthraquinone-based yellow dyes, anthraquinone-based purple dyes, phthalocyanine-based blue dyes, thioindigo-based pink dyes or isoxindigo-based pink dyes may be used either alone or as a combination. Pigments such as carbon black, copper phthalocyanine (C.I. Pigment Blue 15:3), C.I. Pigment Red 112, Pigment blue or isoindoline yellow may be used either alone or as a combination. As such dyes or pigments, those commercially available may be used, and for example, materials manufactured by Ciba ORACET or Chokwang Paint Ltd. may be used. Types of the dyes or pigments and colors thereof are for illustrative purposes only, and various known dyes or pigments may be used, and more diverse colors may be obtained therefrom.

As the matrix resin included in the color film, materials known as materials of transparent films, primer layers, adhesive layers or coating layers may be used, and the matrix resin is not particularly limited to these materials. For example, various materials such as acryl-based resins, polyethylene terephthalate-based resins, urethane-based resins, linear olefin-based resins, cycloolefin-based resins, epoxy-based resins or triacetylcellulose-based resins may be selected, and copolymers or mixtures of the materials illustrated above may also be used.

When the color film is disposed closer to the location observing the decoration member than the light reflective layer or the light absorbing layer as in, for example, the structures of FIGS. 12(a) and (b), and FIGS. 13(a), (b) and (c), light transmittance of the colors developed by the color film from the light reflective layer, the light absorbing layer or the laminated structure of the light reflective layer and the light absorbing layer may be 1% or greater, preferably 3% or greater and more preferably 5% or greater. As a result, target colors may be obtained by combining colors developed from the color film and colors developed from the light reflective layer, the light absorbing layer or the laminated structure thereof.

The thickness of the color film is not particularly limited, and those skilled in the art may select and set the thickness as long as it is capable of obtaining target colors. For example, the color film may have a thickness of 500 nm to 1 mm.

(Pattern Layer)

In one embodiment of the present specification, the color developing layer or the substrate may comprise a pattern layer.

In one embodiment of the present specification, the substrate comprises a pattern layer, and the pattern layer is provided adjacent to the color developing layer.

In the present specification, the pattern layer being provided adjacent to the color developing layer may mean the pattern layer being in direct contact with the color developing layer. For example, the pattern layer may be in direct contact with the light reflective layer of the color developing layer, or the pattern layer may be in direct contact with the light absorbing layer of the color developing layer.

In one embodiment of the present specification, the pattern layer comprises a convex portion or concave portion shape having an asymmetric-structured cross-section.

In one embodiment of the present specification, the pattern layer comprises a convex portion shape having an asymmetric-structured cross-section.

In one embodiment of the present specification, the pattern layer comprises a concave portion shape having an asymmetric-structured cross-section.

In one embodiment of the present specification, the pattern layer comprises a convex portion shape having an asymmetric-structured cross-section and a concave portion shape having an asymmetric-structured cross-section.

In the present specification, the "cross-section" means a surface when cutting the convex portion or the concave portion in any one direction. For example, the cross-section may mean, when placing the decoration member on the ground, a surface when cutting the convex portion or the concave portion in a direction parallel to the ground or a direction perpendicular to the ground. In the surface of the convex portion or concave portion shape of the pattern layer of the decoration member according to the embodiment, at least one of the cross-sections in a direction perpendicular to the ground has an asymmetric structure.

In the present specification, the "asymmetric-structured cross-section" means a structure in which a figure formed with borders of the cross-section does not have line symmetry or point symmetry. Line symmetry refers to having a property of overlapping when mirroring a certain figure centering on a straight line. Point symmetry refers to, when a certain figure rotates 180 degrees based on one point, having a symmetrical property completely overlapping the original figure. Herein, the borders of the asymmetric-structured cross-section may be a straight line, a curved line or a combination thereof.

In the present specification, the "convex portion shape" may comprise one or more "convex portion unit shapes", and the "concave portion shape" may comprise one or more "concave portion unit shapes". The convex portion unit shape or the concave portion unit shape means a shape comprising two inclined sides (first inclined side and second inclined side), and is not a shape comprising three or more inclined sides. When referring to FIG. 21, the convex portion shape (P1) of circle C1 is one convex portion unit shape comprising a first inclined side and a second inclined side. However, the convex portion shape included in circle C2 comprises two convex portion unit shapes. The first inclined side may each be defined as a left inclined side of the convex portion shape or the concave portion shape, and the second inclined side may each mean a right inclined side of the convex portion shape or the concave portion shape.

As described above, the decoration member may develop dichroism by the convex portion or the concave portion having an asymmetric-structured cross-section included in the surface of the pattern layer. Dichroism means different colors being observed depending on a viewing angle. Colors may be expressed by CIE L*a*b*, and a color difference may be defined using a distance ($\Delta E^*ab$) in the L*a*b* space. Specifically, the color difference is $\Delta E = \sqrt{\Delta L^{*2} + \Delta a^{*2} + \Delta b^{*2}}$, and within a range of $0 < \Delta E^*ab < 1$, an observer may not recognize the color difference [reference document: Machine Graphics and Vision 20(4):383-411]. Accordingly, dichroism may be defined by $\Delta E^*ab > 1$ in the present specification.

In one embodiment of the present specification, the color developing layer has dichroism of $\Delta E^*ab > 1$. Specifically, a color difference $\Delta E^*ab$, a distance in L*a*b* space in a color coordinate CIE L*a*b* of the color developing layer, may be greater than 1.

In one embodiment of the present specification, the decoration member has dichroism of $\Delta E^*ab > 1$. Specifically, a color difference ΔE*ab, a distance in L*a*b* space in a color coordinate CIE L*a*b* of the whole decoration member, may be greater than 1.

FIG. 14 illustrates a decoration member comprising the pattern layer according to one embodiment of the present specification (substrate and protective layer not shown). The pattern layer surface may have a shape in which a second convex portion (P2) having a smaller height compared to the convex portion is disposed between the convex portions (P1). Hereinafter, the convex portion stated prior to the second convex portion may be referred to as a first convex portion.

FIG. 15 illustrates a decoration member comprising the pattern layer according to one embodiment of the present specification (color developing layer not shown). The pattern layer surface may have a shape further comprising a concave portion (P3) having a smaller height compared to the convex portion on a tip portion (pointed part) of the convex portion (P1). Such a decoration member may exhibit an effect of an image color softly changing depending on a viewing angle.

In one embodiment of the present specification, the pattern layer comprises a convex portion or concave portion shape, and each of the shapes may be arranged in an inversed phase structure.

FIG. 16 illustrates a decoration member comprising the pattern layer according to one embodiment of the present specification. As illustrated in FIG. 16(a), the pattern layer surface may have a shape of a plurality of convex portions being arranged in an inversed phase structure of 180 degrees. Specifically, the pattern layer surface may comprise a first region (C1) in which the second inclined surface has a larger inclined angle compared to the first inclined surface, and a second region (C2) in which the second inclined surface has a larger inclined angle compared to the first inclined surface. In one example, the convex portion included in the first region may be referred to as a first convex portion (P1), and the convex portion included in the second region may be referred to as a fourth convex portion (P4). As for heights, widths, inclined angles and an angle formed by the first and the second inclined surfaces of the first convex portion (P1) and the fourth convex portion (P4), descriptions provided in the convex portion (P1) may be used in the same manner. As illustrated in FIG. 16(b), it may be constituted such that any one region of the first region and the second region corresponds to an image or a logo, and the other region corresponds to a background part. Such a decoration member may exhibit an effect of an image or logo color softly changing depending on a viewing angle. In addition, a decorative effect of colors of an image or logo part and a background part looking switched depending on a viewing direction.

In one embodiment of the present specification, the first region and the second region may each comprise a plurality of convex portions. Widths of the first region and the second region and the number of convex portions may be properly controlled depending on the size of a target image or logo.

In the present specification, inclined angles (a2, a3) of the convex portion (P1) may mean angles formed between inclined surfaces (S1, S2) of the convex portion (P1) and a horizontal surface of the pattern layer. Unless particularly mentioned otherwise in the present specification, the first inclined surface may be defined as a left inclined surface of the convex portion, and the second inclined surface may mean a right inclined surface of the convex portion in the drawings.

In one embodiment of the present specification, the convex portion (P1) of the pattern layer has a polygonal cross-section, and may have a column shape extending in one direction. In one embodiment, the cross-section of the convex portion (P1) may be a triangle or a shape further comprising a small concave portion on a tip portion (pointed part or vertex part) of the triangle.

In one embodiment of the present specification, an angle (a1) formed by the first inclined surface (S1) and the second inclined surface (S2) may be in a range of 80 degrees to 100 degrees. Specifically, the angle (a1) may be 80 degrees or greater, 83 degrees or greater, 86 degrees or greater or 89 degrees or greater, and may be 100 degrees or less, 97 degrees or less, 94 degrees or less or 91 degrees or less. The angle may mean an angle of a vertex formed by the first inclined surface and the second inclined surface. When the first inclined surface and the second inclined surface do not form a vertex with each other, the angle may mean an angle of a vertex in a state forming a vertex by virtually extending the first inclined surface and the second inclined surface.

In one embodiment of the present specification, a difference between an inclined angle of the first inclined surface (a2) and an inclined angle of the second inclined surface (a3) of the convex portion (P1) may be in a range of 30 degrees to 70 degrees. A difference between the inclined angle of the first inclined surface (a2) and the inclined angle of the second inclined surface (a3) may be, for example, 30 degrees or greater, 35 degrees or greater, 40 degrees or greater or 45 degrees or greater, and may be 70 degrees or less, 65 degrees or less, 60 degrees or less or 55 degrees or less. Having an inclined angle difference between the first inclined surface and the second inclined surface in the above-mentioned range may be advantageous in terms of obtaining direction-dependent color expression. In other words, dichroism more significantly appears.

In one embodiment of the present specification, the convex portion (P1) may have a height (H1) of 5 μm to 30 μm. Having the convex portion height in the above-mentioned range may be advantageous in a production process aspect. In the present specification, the convex portion height may mean a shortest distance between a highest part and a lowest part of the convex portion based on the horizontal surface of the pattern layer. As for the descriptions relating to the height of the convex portion, the same numerical range may also be used in the depth of the concave portion described above.

In one embodiment of the present specification, the convex portion (P1) may have a width (W1) 10 μm to 90 μm. Having the convex portion width in the above-mentioned range may be advantages in a process aspect in processing and forming a pattern. The width of the convex portion (P1) may be, for example, 10 μm or greater, 15 μm or greater, 20 μm or greater or 25 μm or greater, and may be 90 μm or less, 80 μm or less, 70 μm or less, 60 μm or less, 50 μm or less, 40 μm or less or 35 μm or less. The descriptions relating to the width may be used in the concave portion described above as well as the convex portion.

In one embodiment of the present specification, a distance between the convex portions (P1) may be from 0 μm to 20 μm. The distance between the convex portions in the present specification may mean, in two adjacent convex portions, a shortest distance between a point where one convex portion ends and a point where another convex portion starts. When properly maintaining the distance between the convex portions, a phenomenon of a reflection area looking dark due to shading when a relatively bright color is to be obtained when looking at the decoration member from an inclined surface side of the convex portion having a larger inclined angle may be improved. Between the convex portions, a second convex portion with a smaller height compared to the convex portion may be present as to be described later. The descriptions relating to the distance may be used in the concave portion described above as well as the convex portion.

In one embodiment of the present specification, a height (H2) of the second convex portion (P2) may be in a range of ⅕ to ¼ of the height (H1) of the first convex portion (P1). For example, a height difference (H1−H2) between the first convex portion and the second convex portion may be from 10 μm to 30 μm. A width (W2) of the second convex portion may be from 1 μm to 10 μm. Specifically, the width (W2) of the second convex portion may be 1 μm or greater, 2 μm or greater, 3 μm or greater, 4 μm or greater or 4.5 μm or greater, and may be 10 μm or less, 9 μm or less, 8 μm or less, 7 μm or less, 6 μm or less or 5.5 μm or less.

In one embodiment of the present specification, the second convex portion may have two inclined surfaces (S3, S4) having different inclined angles. An angle (a4) formed by the two inclined surfaces of the second convex portion may be from 20 degrees to 100 degrees. Specifically, the angle (a4) may be 20 degrees or greater, 30 degrees or greater, 40 degrees or greater, 50 degrees or greater, 60 degrees or greater, 70 degrees or greater, 80 degrees or greater or 85 degrees or greater, and may be 100 degrees or less or 95 degrees or less. An inclined angle difference (a6−a5) between both inclined surfaces of the second convex portion may be from 0 degrees to 60 degrees. The inclined angle difference (a6−a5) may be 0 degrees or greater, 10 degrees or greater, 20 degrees or greater, 30 degrees or greater, 40 degrees or greater or 45 degrees or greater, and may be 60 degrees or less or 55 degrees or less. The second convex portion having a dimension in the above-mentioned range may be advantageous in terms of forming bright color by increasing light inflow from a side surface having a large inclined surface angle.

In one embodiment of the present specification, a height (H3) of the concave portion (P3) may be from 3 μm to 15 μm. Specifically, a height (H3) of the concave portion (P3) may be 3 μm or greater, and may be 15 μm or less, 10 μm or less or 5 μm or less. The concave portion may have two inclined surfaces (S5, S6) having different inclined angles. An angle (a7) formed by the two inclined surfaces of the concave portion may be from 20 degrees to 100 degrees. Specifically, the angle (a7) may be 20 degrees or greater, 30 degrees or greater, 40 degrees or greater, 50 degrees or greater, 60 degrees or greater, 70 degrees or greater, 80 degrees or greater or 85 degrees or greater, and may be 100 degrees or less or 95 degrees or less. An inclined angle difference (a9−a8) between both inclined surfaces of the concave portion may be from 0 degrees to 60 degrees. The inclined angle difference (a9−a8) may be 0 degrees or greater, 10 degrees or greater, 20 degrees or greater, 30 degrees or greater, 40 degrees or greater or 45 degrees or greater, and may be 60 degrees or less or 55 degrees or less. The concave portion having a dimension in the above-mentioned range may be advantageous in terms of adding a color sense on the inclined surface.

In one embodiment of the present specification, the pattern layer comprises a convex portion shape, the cross-section of the convex portion shape comprises a first inclined side and a second inclined side, and shapes of the first inclined side and the second inclined side are the same as or different from each other, and are each a straight-line shape or a curved-line shape.

FIG. 17 illustrates a decoration member comprising the pattern layer according to one embodiment of the present specification. The cross-section of the pattern layer has a convex portion shape, and the cross-section of the convex portion shape comprises a first region (D1) comprising a first inclined side and a second region (D2) comprising a second inclined side. The first inclined side and the second inclined side have a straight-line shape. An angle (c3) formed by the first inclined side and the second inclined side may be from 75 degrees to 105 degrees, or from 80 degrees to 100 degrees. An angle (c1) formed by the first inclined side and the ground and an angle (c2) formed by the second inclined side and the ground are different. For example, a combination of c1 and c2 may be 20 degrees/80 degrees, 10 degrees/70 degrees or 30 degrees/70 degrees.

FIG. 18 illustrates a decoration member comprising the pattern layer according to one embodiment of the present specification. The cross-section of the pattern layer comprises a convex portion shape, and the cross-section of the convex portion shape comprises a first region (E1) comprising a first inclined side and a second region (E2) comprising a second inclined side. Any one or more of the first inclined side and the second inclined side may have a curved-line shape. For example, the first inclined side and the second inclined side may both have a curved-line shape, or the first inclined side may have a straight-line shape, and the second inclined side may have a curved-line shape. When the first inclined side has a straight-line shape and the second inclined side has a curved-line shape, the angle c1 may be larger than the angle c2. FIG. 18 illustrates a case when the first inclined side has a straight-line shape and the second inclined side has a curved-line shape. An angle formed by the inclined side having a curved-line shape with the ground may be calculated from, when drawing an arbitrary straight line from a point where the inclined side touching the ground to a point where the first inclined side and the second inclined side adjoin, an angle formed by the straight line and the ground. The curved-line-shaped second inclined side may have a different curvature depending on the pattern layer height, and the curved line may have a radius of curvature. The radius of curvature may be 10 times or less than the width (E1+E2) of the convex portion shape. FIG. 18(a) shows a radius of curvature of the curved line being twice the width of the convex portion shape, and FIG. 18(b) shows a radius of curvature of the curved line being the same as the width of the convex portion shape. A ratio of the part (E2) having a curvature with respect to the width (E1+E2) of the convex portion may be 90% or less. FIGS. 18(a) and (b) illustrate a ratio of the part (E2) having a curvature with respect to the width (E1+E2) of the convex portion being 60%.

In one embodiment of the present specification, the cross-section of the convex portion shape may have a polygonal shape of triangle or quadrangle.

FIG. 19 illustrates a decoration member comprising the pattern layer according to one embodiment of the present specification. The cross-section of the pattern layer has a convex portion shape, and the cross-section of the convex portion shape may have a quadrangle shape. The quadrangle shape may be a general quadrangle shape, and is not particularly limited as long as an inclined angle of each inclined side is different. The quadrangle shape may be a shape left after partially cutting a triangle. For example, a trapezoid that is a quadrangle in which one pair of opposite sides is parallel, or a quadrangle shape in which a pair of opposite sides parallel to each other is not present may be included. The cross-section of the convex portion shape comprises a first region (F1) comprising a first inclined side, a second region (F2) comprising a second inclined side and a third region (F3) comprising a third inclined side. The third inclined side may or may not be parallel to the ground. For example, when the quadrangle shape is a trapezoid, the third inclined side is parallel to the ground. Any one or more of the first inclined side to the third inclined side may have a curved-line shape, and descriptions on the curved-line shape are the same as described above. The combined length of F1+F2+F3 may be defined as a width of the convex portion shape, and descriptions on the width are the same as the descriptions provided above.

In one embodiment of the present specification, the pattern layer comprises two or more convex portion shapes, and a flat portion may be further included in a part or all of between each convex portion shape.

FIG. 20 illustrates a decoration member comprising the pattern layer according to one embodiment of the present specification. A flat portion may be included between each convex portion of the pattern layer. The flat portion means a region in which the convex portion is not present. Other than the pattern layer further comprising a flat portion, descriptions on the remaining constituents (D1, D2, c1, c2, c3, first inclined side and second inclined side) are the same as the descriptions provided above. Meanwhile, a combined length of D1+D2+G1 is defined as a pitch of the pattern, which is different from the width of the pattern described above.

In one embodiment of the present specification, the surface of the convex portion or the concave portion shape comprises two or more of the convex portion or concave portion shapes. By having a surface of two or more convex portion or concave portion shapes as above, dichroism may further increase. Herein, the two or more convex portion or concave portion shapes may have a form of repeating identical shapes, however, shapes different from each other may be included.

In one embodiment of the present specification, in the convex portion or concave portion shape having an asymmetric-structured cross-section, at least one cross-section comprises two or more sides having different inclined angles, different curvatures, or different side shapes. For example, when two sides among the sides forming at least one cross-section have different inclined angles, different curvatures, or different side shapes, the convex portion or the concave portion has an asymmetric structure.

In one embodiment of the present specification, in the shape of the convex portion or the concave portion, at least one cross-section comprises a first inclined side and a second inclined side having different inclined angles.

In the present specification, unless mentioned otherwise, the "side" may be a straight line, but is not limited thereto, and a part or all thereof may be a curved line. For example, the side may comprise a structure of a part of an arc of a circle or oval, a wave structure or a zigzag.

In the present specification, when the side comprises a part of an arc of a circle or an oval, the circle or the oval may have a radius of curvature. The radius of curvature may be defined by, when converting an extremely short section of a curved line into an arc, the radius of the arc.

In the present specification, unless mentioned otherwise, the "inclined side" means, when placing the decoration member on the ground, a side having an angle formed by the side with respect to the ground being greater than 0 degrees and less than or equal to 90 degrees. Herein, when the side is a straight line, an angle formed by the straight line and the ground may be measured. When the side comprises a curved line, an angle formed by, when placing the decoration member on the ground, the ground and a straight line connecting a point closest to the ground of the side and a point farthest from the ground of the side in a shortest distance may be measured.

In the present specification, unless mentioned otherwise, the inclined angle is an angle formed by, when placing the decoration member on the ground, the ground and a surface or a side forming the pattern layer, and is greater than 0 degrees and less than or equal to 90 degrees. Alternatively, it may mean an angle formed by the ground and a line segment (a'-b') made when connecting a point (a') where a surface or a side forming the pattern layer adjoins the ground and a point (b') where a surface or a side forming the pattern layer is farthest from the ground.

In the present specification, unless mentioned otherwise, the curvature means a degree of changes in the slope of the tangent at continuous points of a side or a surface. As the change in the slope of the tangent at continuous points of a side or a surface is larger, the curvature is high.

In the present specification, the convex portion may be a convex portion unit shape, and the concave portion may be a concave portion unit shape. The convex portion unit shape or the concave portion unit shape means a shape comprising two inclined sides (first inclined side and second inclined side), and is not a shape comprising three or more inclined sides. When referring to FIG. 21, the convex portion (P1) of circle C1 is one convex portion unit shape comprising a first inclined side and a second inclined side. However, the shape included in circle C2 comprises two convex portion unit shapes. The first inclined side may be defined as a left inclined side of the convex portion or the concave portion, and the second inclined side may mean a right inclined side of the convex portion or the concave portion.

In one embodiment of the present specification, an angle (a1) formed by the first inclined side and the second inclined side may be in a range of 80 degrees to 100 degrees. Specifically, the angle (a1) may be 80 degrees or greater, 83 degrees or greater, 86 degrees or greater or 89 degrees or greater, and may be 100 degrees or less, 97 degrees or less, 94 degrees or less or 91 degrees or less. The angle may mean an angle of a vertex formed by the first inclined side and the second inclined side. When the first inclined side and the second inclined side do not form a vertex with each other, the angle may mean an angle of a vertex in a state forming a vertex by virtually extending the first inclined side and the second inclined side.

In one embodiment of the present specification, a difference between an inclined angle of the first inclined side (a2) and an inclined angle of the second inclined side (a3) of the convex portion (P1) may be in a range of 30 degrees to 70 degrees. A difference between the inclined angle of the first inclined side (a2) and the inclined angle of the second inclined side (a3) may be, for example, 30 degrees or greater, 35 degrees or greater, 40 degrees or greater or 45 degrees or greater, and may be 70 degrees or less, 65 degrees or less, 60 degrees or less or 55 degrees or less. Having an inclined angle difference between the first inclined side and the second inclined side in the above-mentioned range may be advantageous in terms of obtaining direction-dependent color expression.

FIG. 22 illustrates the pattern layer of a decoration member according to one embodiment of the present specification, and a method for preparing the same. The cross-section of the pattern layer has a convex portion shape, and the cross-section of the convex portion shape may have a shape removing a specific region of the ABO1 triangle shape. A method of determining the removed specific region is as follows. Details on the inclined angles c1 and c2 are the same as the descriptions provided above.

1) An arbitrary point P1 on an AO1 line segment dividing the AO1 line segment in a ratio of L1:L2 is set.
2) An arbitrary point P2 on a BO1 line segment dividing the BO1 line segment in a ratio of m1:m2 is set.
3) An arbitrary point O2 on an AB line segment dividing the AB line segment in a ratio of n1:n2 is set.
4) An arbitrary point P3 on an O1O2 line segment dividing the O2O1 line segment in a ratio of o1:o2 is set.

Herein, the ratios of L1:L2, m1:m2, n1:n2 and o1:o2 are the same as or different from each other, and may be each independently from 1:1000 to 1000:1.

5) The region formed by the P1O1P2P3 polygon is removed.
6) The shape formed by the ABP2P3P1 polygon is employed as the cross-section of the convex portion.

The pattern layer may be modified to various shapes by adjusting the ratios of L1:L2, m1:m2, n1:n2 and o1:o2. For example, the height of the pattern may increase when L1 and m1 increase, and the height of the concave portion formed on the convex portion may decrease when o1 increases, and by adjusting the ratio of n1, the position of a lowest point of the concave portion formed on the convex portion may be adjusted to be closer to any one side of the inclined sides of the convex portion.

FIG. 23 illustrates the pattern layer prepared using the method for preparing the pattern layer of a decoration member according to FIG. 22. When the ratios of L1:L2, m1:m2 and o1:o2 are all the same, the cross-section shape may be a trapezoidal shape. The height of the trapezoid (ha, hb) may vary by adjusting the ratio of L1:L2. For example, FIG. 23(a) illustrates a pattern layer prepared when the L1:L2 ratio is 1:1, and FIG. 23(b) illustrates a pattern layer prepared when the L1:L2 ratio is 2:1.

In one embodiment of the present specification, the convex portion or concave portion shape of the pattern layer surface may be a cone-shaped convex portion protruding out of the surface of the pattern layer or a cone-shaped concave portion sunk into the surface of the pattern layer.

In one embodiment of the present specification, the cone shape comprises a shape of a circular cone, an oval cone or a polypyramid. Herein, the shape of the bottom surface of the polypyramid comprises a triangle, a quadrangle, a star shape having 5 or more protruding points, and the like. According to one embodiment, when the pattern layer surface has a cone-shaped convex portion shape when placing the decoration member on the ground, at least one of cross-sections vertical with respect to the ground of the convex portion shape may have a triangle shape. According to another embodiment, when the pattern layer surface has a cone-shaped concave portion shape when placing the decoration member on the ground, at least one of the cross-sections vertical with respect to the ground of the convex portion shape may have an inverted triangle shape.

In one embodiment of the present specification, the cone-shaped convex portion or cone-shaped concave portion shape may have at least one asymmetric-structured cross-section. For example, when observing the cone-shaped convex portion or concave portion from a surface side of the convex portion or concave portion shape, having two or less identical shapes when rotating 360 degrees based on the vertex of the cone is advantageous in developing dichroism. FIG. 24 shows the cone-shaped convex portion shape observed from the surface side of the convex portion shape, and (a) all illustrates a symmetric-structured cone shape, and (b) illustrates an asymmetric-structured cone shape.

When placing the decoration member on the ground, the symmetric-structured cone shape has a structure in which a cross-section in a direction parallel to the ground (hereinafter, referred to as a horizontal cross-section) is a circle or a regular polygon having the same side length, and the vertex of the cone is present on the vertical line with respect to the cross-section of the center of gravity of the horizontal cross-section with respect to the ground. However, the cone shape having an asymmetric-structured cross-section has a structure in which, when observing from a surface side of the cone-shaped convex portion or concave portion, the position of the vertex of the cone is present on a vertical line of a point that is not the center of gravity of the horizontal cross-section of the cone, or has a structure in which the horizontal cross-section of the cone is an asymmetric-structured polygon or oval. When the horizontal cross-section of the cone is an asymmetric-structured polygon, at least one of the sides and the angles of the polygon may be designed to be different from the rest.

For example, as in FIG. 25, the position of the vertex of the cone may be changed. Specifically, when designing the vertex of the cone to be located on a vertical line of the center of gravity (O1) of the horizontal cross-section with respect to the ground of the cone when observing from a surface side of the cone-shaped convex portion shape as in the first drawing of FIG. 25, 4 identical structures may be obtained when rotating 360 degrees based on the vertex of the cone (4-fold symmetry). However, the symmetric structure is broken by designing the vertex of the cone on a position (O2) that is not the center of gravity (O1) of the horizontal cross-section with respect to the ground. When employing a length of one side of the horizontal cross-section with respect to the ground as x, migration distances of the vertex of the cone as a and b, a height of the cone shape, a length of a line vertically connecting from the vertex of the cone (O1 or O2) to the cross-section horizontal with respect to the ground, as h, and an angle formed by the horizontal cross-section and a side surface of the cone as θn, cosine values for Surface 1, Surface 2, Surface 3 and Surface 4 of FIG. 25 may be obtained as follows.

$$\cos(\Theta 1) = \frac{\left(\frac{x}{2}\right)}{sqrt\left(h^2 + \left(\frac{x}{2}\right)^2\right)} \quad \cos(\Theta 3) = \frac{\left(\frac{x}{2} - a\right)}{sqrt\left(h^2 + \left(\frac{x}{2} - a\right)^2\right)}$$

$$\cos(\Theta 2) = \frac{\left(\frac{x}{2}\right)}{sqrt\left(h^2 + \left(\frac{x}{2}\right)^2\right)} \quad \cos(\Theta 4) = \frac{\left(\frac{x}{2} - b\right)}{sqrt\left(h^2 + \left(\frac{x}{2} - b\right)^2\right)}$$

Herein, θ1 and θ2 are the same, and therefore, there is no dichroism. However, θ3 and θ4 are different, and |θ3−θ4| means a color difference (ΔE*ab) between two colors, and therefore, dichroism may be obtained. Herein, |θ3−θ4|>0. As above, how much the symmetric structure is broken, that is, a degree of asymmetry, may be represented quantitatively using an angle formed by the horizontal cross-section with respect to the ground and a side surface of the cone, and the value representing such a degree of asymmetry is proportional to a color difference of dichroism.

FIG. 26 illustrates a surface having a convex portion shape in which a highest point has a line shape, and (a) illustrates a pattern having a convex portion developing no dichroism and (b) illustrates a pattern having a convex portion developing dichroism. An X-X' cross-section of FIG. 26(a) is an isosceles triangle or an equilateral triangle, and a Y-Y' cross-section of FIG. 26(b) is a triangle having different side lengths.

In one embodiment of the present specification, the pattern layer has a surface of a convex portion shape in which a highest point has a line shape or a concave portion shape in which a lowest point has a line shape. The line shape may be a straight-line shape or a curved-line shape, and may comprise both a curved line and a straight line, or a zigzag shape. This is illustrated in FIG. 27 to FIG. 29. When observing the surface of the convex portion shape in which a highest point has a line shape or the concave portion shape in which a lowest point has a line shape from a surface side of the convex portion or concave portion shape, having only one identical shape when rotating 360 degrees based on the center of gravity of the horizontal cross-section with respect to the ground of the convex portion or the concave portion is advantageous in developing dichroism.

In one embodiment of the present specification, the pattern layer has a surface of a convex portion or concave portion shape in which a cone-type tip portion is cut. FIG. 30 illustrates images obtaining, when placing a decoration member on the ground, an inversed trapezoidal concave portion in which a cross-section perpendicular to the ground is asymmetric. Such an asymmetric cross-section may have a trapezoidal or inversed trapezoidal shape. In this case, dichroism may also be developed by the asymmetric-structured cross-section.

In addition to the structures illustrated above, various surfaces of convex portion or concave portion shapes as in FIG. 31 may be obtained.

In the present specification, unless mentioned otherwise, the "surface" may be a flat surface, but is not limited thereto, and a part or all thereof may be a curved surface. For example, the shape of a cross-section in a direction perpendicular to the surface may comprise a structure of a part of an arc of a circle or oval, a wave structure or a zigzag.

In one embodiment of the present specification, the pattern layer comprises a symmetric-structured pattern. As the symmetric structure, a prism structure, a lenticular lens structure and the like are included.

In one embodiment of the present specification, the decoration member comprises a pattern layer comprising a convex portion or concave portion shape having an asymmetric-structured cross-section on a surface facing the light reflective layer of the light absorbing layer; between the light absorbing layer and the light reflective layer; or a surface facing the light absorbing layer of the light reflective layer.

In one embodiment of the present specification, the pattern layer has a flat portion on a surface opposite to the convex portion or concave portion shape-formed surface, and the flat portion may be formed on a substrate. As the substrate layer, a plastic substrate may be used. As the plastic substrate, triacetyl cellulose (TAC); a cycloolefin copolymer (COP) such as a norbornene derivative; poly(methyl methacrylate (PMMA); polycarbonate (PC); polyethylene (PE); polypropylene (PP); polyvinyl alcohol (PVA); diacetyl cellulose (DAC); polyacrylate (Pac); polyether sulfone (PES); polyetheretherketone (PEEK); polyphenyl sulfone (PPS); polyetherimide (PEI); polyethylene naphthalate (PEN); polyethylene terephthalate (PET); polyimide (PI); polysulfone (PSF); polyarylate (PAR), an amorphous fluorine resin or the like may be used, however, the plastic substrate is not limited thereto.

In one embodiment of the present specification, the pattern layer may comprise a thermo-curable resin or an ultraviolet-curable resin. As the curable resin, a photo-curable resin or a thermo-curable resin may be used. As the photo-curable resin, an ultraviolet-curable resin may be used. Examples of the thermo-curable resin may comprise a silicone resin, a silicon resin, a furan resin, a polyurethane resin, an epoxy resin, an amino resin, a phenol resin, a urea resin, a polyester resin, a melamine resin or the like, but are not limited thereto. As the ultraviolet-curable resin, an acrylic polymer, for example, a polyester acrylate polymer, a polystyrene acrylate polymer, an epoxy acrylate polymer, a polyurethane acrylate polymer or a polybutadiene acrylate polymer, a silicone acrylate polymer, an alkyl acrylate polymer or the like may be typically used, however, the ultraviolet-curable resin is not limited thereto.

In one embodiment of the present specification, a color dye may be further included inside or at least one surface of the pattern layer. Comprising a color dye on at least one surface of the pattern layer may mean a case of, for example, comprising a color dye on the above-described substrate layer provided on the flat portion side of the pattern layer.

In one embodiment of the present specification, as the color dye, an anthraquinone-based dye, a phthalocyanine-based dye, a thioindigo-based dye, a perinone-based dye, an isoxindigo-based dye, a methane-based dye, a monoazo-based dye, a 1:2 metal complex-based dye and the like may be used.

In one embodiment of the present specification, when comprising the color dye inside the pattern layer, the dye may be added to the curable resin. When further comprising the color dye at the bottom of the pattern layer, a method of coating the dye-comprising layer on the top or the bottom of the substrate layer may be used.

In one embodiment of the present specification, the color dye content may be, for example, from 0 wt % to 50 wt %. The color dye content may determine transmittance and haze ranges of the pattern layer or the decoration member, and the transmittance may be, for example, from 20% to 90%, and the haze may be, for example, from 1% to 40%.

In one embodiment of the present specification, the color developing layer may provide metallic texture and depth of colors when looking at the decoration member. The color developing layer allows an image of the decoration member to be seen in various colors depending on a viewing angle. This is due to the fact that a wavelength of light passing through the pattern layer and reflected on the surface of an inorganic material layer changes depending on a wavelength of incident light.

The color developing layer may have the same convex portion or concave portion as the surface of the pattern layer described above. The color developing layer may have the same slope as the surface of the pattern layer described above.

In one embodiment of the present specification, the decoration member comprises a protective layer provided between the substrate and the color developing layer; a surface facing the substrate of the color developing layer; or a surface facing the color developing layer of the substrate.

In one embodiment of the present specification, the decoration member comprises a protective layer provided on any one or more of between the substrate and the pattern layer, between the pattern layer and the light reflective layer, between the light reflective layer and the light absorbing layer, and on a surface opposite to the surface facing the light reflective layer of the light absorbing layer. In other words, the protective layer performs a role of protecting the decoration member by being provided between each layer of the decoration member or at an outermost part of the decoration member.

In the present specification, the "protective layer" means, unless defined otherwise, a layer capable of protecting other layers of the decoration member. For example, deterioration of an inorganic material layer under a humidity resistant or heat resistant environment may be prevented. Alternatively, scratching on an inorganic material layer or a pattern layer by external factors is effectively suppressed enabling the decoration member to effectively develop dichroism.

In the present specification, the 'inorganic material layer' means, unless defined otherwise, a light absorbing layer or a light reflective layer.

In the present specification, an example of the decoration member structure comprising the protective layer is as follows.

For example, a structure of substrate/protective layer/pattern layer/light reflective layer/light absorbing layer/protective layer or substrate/protective layer/pattern layer/light absorbing layer/light reflective layer/protective layer may be included.

In one embodiment of the present specification, the protective layer comprises an aluminum oxynitride. By the protective layer comprising an aluminum oxynitride (AlON), functions of the protective layer to describe later may be enhanced compared to when the protective layer does not comprise an aluminum oxynitride (AON). In addition, functions of protection may be further enhanced when adjusting a ratio of each element of the aluminum oxynitride.

In one embodiment of the present specification, by further comprising the protective layer, the decoration member suppresses damages on the pattern layer and the organic material layer even when being left unattended under a high temperature and high humidity environment, and therefore, excellent decorative effects may be maintained even under a harsh environment.

The decoration member of the present specification may be used in known subjects requiring the use of a decoration member. For example, they may be used in portable electronic devices, electronic products, cosmetic containers, furniture, construction materials and the like without limit.

A manner of using the decoration member in portable electronic devices, electronic products, cosmetic containers, furniture, construction materials and the like is not particularly limited, and known methods known as a method of using a deco film in the art may be used. The decoration member may further comprise an adhesive layer as necessary. In another embodiment, the decoration member may be used by being directly coated on a portable electronic device or an electronic product. In this case, a separate adhesive layer for attaching the decoration member to the portable electronic device or the electronic product may not be required. In another embodiment, the decoration member may be attached to a portable electronic device or an electronic product using an adhesive layer as a medium. As the adhesive layer, an optically clear adhesive tape (OCA tape) or an adhesive resin may be used. As the OCA tape or the adhesive resin, OCA tapes or adhesive resins known in the art may be used without limit. As necessary, a peel-off layer (release liner) may be further provided for protecting the adhesive layer.

In one embodiment of the present specification, the light reflective layer and the light absorbing layer may each be formed on a substrate or a pattern of a pattern layer of the substrate using a sputter method, an evaporation method, a vapor deposition method, a chemical vapor deposition (CVD) method, wet coating and the like. Particularly, the sputter method has straightness, and therefore, a difference in the deposition thicknesses of both inclined surfaces of the convex portion may be maximized by tilting a position of a target.

In one embodiment of the present specification, the light reflective layer and the light absorbing layer may each be formed using a reactive sputtering method. Reactive sputtering is a method in which an ion having energy (for example, $Ar^+$) gives an impact on a target material, and the target material coming off is deposited on the surface to deposit. Herein, the base pressure may be $1.0 \times 10^5$ torr or less, $6.0 \times 10^{-6}$ torr or less, and preferably $3.0 \times 10^{-6}$ torr or less.

In one embodiment of the present specification, the reactive sputtering method may be conducted in a chamber comprising a plasma gas and a reactive gas. The plasma gas may be argon (Ar) gas. In addition, the reactive gas required to form the inorganic material layer is oxygen ($O_2$) and nitrogen ($N_2$), and is distinguished from the plasma gas as a gas for providing oxygen or nitrogen atoms.

In one embodiment of the present specification, the plasma gas may have a flow rate of greater than or equal to 10 sccm and less than or equal to 300 sccm, and preferably greater than or equal to 20 sccm and less than or equal to 200 sccm. The sccm means a standard cubic centimeter per minute.

In one embodiment of the present specification, a process pressure (p1) in the chamber may be from 1.0 mtorr to 10.0 mtorr, and preferably from 1.5 mtorr to 10.0 mtorr. When the process pressure is higher than the above-mentioned range during the sputtering, the number of Ar particles present in the chamber increases, and particles emitted from the target collide with the Ar particles losing energy, which may decrease a growth rate of a thin film. When the process pressure is maintained too low on the other hand, an energy loss of the molybdenum-titanium oxide particles caused by the Ar particles decreases, however, there is a disadvantage in that the substrate may be damaged due to particles having high energy, or qualities of the protective layer may decline.

In one embodiment of the present specification, the reactive gas may have a fraction of greater than or equal to 30% and less than or equal to 70%, preferably greater than or equal to 40% and less than or equal to 70%, and more preferably greater than or equal to 50% and less than or equal to 70% with respect to the plasma gas. The fraction of the reactive gas may be calculated by ($Q_{reactive\ gas}/Q_{plasma\ process\ gas}$)*100%). The $Q_{reactive\ gas}$ means a flow rate of the reactive gas in the chamber, and $Q_{plasma\ process\ gas}$ may be a flow rate of the plasma process gas in the chamber. When satisfying the above-mentioned numerical range, the atomic ratio of the molybdenum-titanium oxide described above may be adjusted to a target range.

In one embodiment of the present specification, the reactive sputtering method may have driving power of greater than or equal to 100 W and less than or equal to 500 W, and preferably greater than or equal to 150 W and less than or equal to 300 W.

In one embodiment of the present specification, a range of a voltage applied in the reactive sputtering method may be greater than or equal to 350 V and less than or equal to 500 V. The voltage range may be adjusted depending on the state of the target, the process pressure, the driving power (process power) or the fraction of the reactive gas.

In one embodiment of the present specification, the reactive sputtering method may have a deposition temperature of higher than or equal to 20° C. and lower than or equal to 300° C. When depositing at a temperature lower than the above-mentioned range, there is a problem in that particles coming off from the target and reaching the substrate have insufficient energy required for crystal growth decreasing crystallinity of thin film growth, and at a temperature higher than the above-mentioned range, particles coming off from the target evaporate or re-evaporate causing a problem of reducing a thin film growth rate.

Hereinafter, the present application will be specifically described with reference to examples, however, the scope of the present specification is not limited by the following examples.

EXAMPLE AND COMPARATIVE EXAMPLE

Example 1

A prism-shaped pattern layer having each inclined angle of 20 degrees/70 degrees was formed by coating an ultraviolet-curable resin on a PET substrate. After that, a color developing layer comprising a light absorbing layer and a light reflective layer was formed on the pattern layer using a reactive sputtering method.

Specifically, a reactive sputtering method was used, and a molybdenum target and a titanium target were used. An argon gas flow rate was adjusted to 35 sccm and an oxygen gas flow rate was adjusted to 15 sccm, and a process pressure was maintained at 9 mtorr and power was maintained at 200 W. Through this, a 10 nm light absorbing layer having a composition of the following Table 2 was formed. After that, In having a thickness of 70 nm was deposited on the light absorbing layer using a sputtering method to form a light reflective layer, and a final decoration member was prepared.

Example 2

A decoration member was prepared in the same manner as in Example 1 except that the light absorbing layer thickness was adjusted to 20 nm.

Example 3

A decoration member was prepared in the same manner as in Example 1 except that the light absorbing layer thickness was adjusted to 30 nm.

Example 4

A decoration member was prepared in the same manner as in Example 1 except that the light absorbing layer thickness was adjusted to 40 nm.

Comparative Example 1

A decoration member was prepared in the same manner as in Example 1 except that the light absorbing layer thickness was adjusted to 50 nm.

Comparative Example 2

A decoration member was prepared in the same manner as in Example 1 except that the light absorbing layer thickness was adjusted to 60 nm.

Comparative Example 3

A decoration member was prepared in the same manner as in Example 1 except that the light absorbing layer thickness was adjusted to 70 nm.

Comparative Example 4

A decoration member was prepared in the same manner as in Example 1 except that the light absorbing layer thickness was adjusted to 80 nm.

Example 5

A decoration member was prepared in the same manner as in Example 1 except that the light absorbing layer thickness was adjusted to 90 nm.

Example 6

A decoration member was prepared in the same manner as in Example 1 except that the light absorbing layer thickness was adjusted to 100 nm.

TABLE 2

| | Light Absorbing Layer Thickness ($T_1$) | Thickness Parameter $T_x$ (Equation 2) | Component Ratio at Each Location ($Mo_aTi_bO_x$) | | | | $\omega$ Value (Equation 1) |
|---|---|---|---|---|---|---|---|
| | | | a ($*10^{-2}$) | b ($*10^{-2}$) | x ($*10^{-2}$) | $\sigma_x$ (Equation 3) | |
| Example 1 | 10 nm | 0.125 | 0.263 | 0.146 | 0.591 | 0.692 | 0.0865 |
| Example 2 | 20 nm | 0.25 | 0.263 | 0.146 | 0.591 | 0.692 | 0.173 |
| Example 3 | 30 nm | 0.375 | 0.263 | 0.146 | 0.591 | 0.692 | 0.2595 |
| Example 4 | 40 nm | 0.5 | 0.263 | 0.146 | 0.591 | 0.692 | 0.346 |
| Comparative Example 1 | 50 nm | 0.625 | 0.263 | 0.146 | 0.591 | 0.692 | 0.4325 |
| Comparative Example 2 | 60 nm | 0.75 | 0.263 | 0.146 | 0.591 | 0.692 | 0.519 |
| Comparative Example 3 | 70 nm | 0.875 | 0.263 | 0.146 | 0.591 | 0.692 | 0.6055 |
| Comparative Example 4 | 80 nm | 1 | 0.263 | 0.146 | 0.591 | 0.692 | 0.692 |
| Example 5 | 90 nm | 0.125 | 0.263 | 0.146 | 0.591 | 0.692 | 0.0865 |
| Example 6 | 100 nm | 0.25 | 0.263 | 0.146 | 0.591 | 0.692 | 0.173 |

<Evaluation Example (Evaluation of Color)>

Component ratios of the decoration members prepared in the examples and the comparative examples were analyzed, and a color appearing by each thickness was observed, and is recorded in the following Table 3.

TABLE 3

|  | Lch Coordinate | | | |
|  | L* | c* | h* | Color |
| --- | --- | --- | --- | --- |
| Example 1 | 60 | 13 | 70 | Warm tone |
| Example 2 | 52 | 25 | 72 | |
| Example 3 | 38 | 28 | 59 | |
| Example 4 | 29 | 18 | 350 | |
| Comparative Example 1 | 31 | 20 | 255 | Cool tone |
| Comparative Example 2 | 39 | 18 | 267 | |
| Comparative Example 3 | 47 | 13 | 250 | |
| Comparative Example 4 | 52 | 7 | 214 | |
| Example 5 | 97 | 3 | 141 | Warm tone |
| Example 6 | 96 | 8 | 116 | |

In the decoration members of the examples, warm colors appeared, however, cool colors appeared in the decoration members of the comparative examples. Colors appearing from the light absorbing layers of the decoration members of Examples 1 to 4 and Comparative Examples 1 to 4 are shown in FIG. 34.

When comparing the examples and the comparative examples, it was identified that, even when the light absorbing layer had the same composition, warm colors or cool colors appeared when changing the thickness.

The invention claimed is:

1. A decoration member comprising:
a color developing layer comprising a light reflective layer and a light absorbing layer provided on the light reflective layer; and
a substrate provided on one surface of the color developing layer,
wherein the light absorbing layer comprises a molybdenum-titanium oxide represented by Chemical Formula 1; and
ω represented by Equation 1 is greater than or equal to 0.001 and less than or equal to 0.4 when conducting a component analysis of the molybdenum-titanium oxide on any one point of the light absorbing layer:

$Mo_a Ti_b O_x$  [Chemical Formula 1]

$\omega = (T_x) \times (\sigma_x)$  [Equation 1]

$f(T_1) = \dfrac{T_1}{T_0} (0 < T_1 \leq T_0)$  [Equation 2]

$f(T_1) = f(T_1 + n \times T_0)$  [Equation 4]

$\sigma_x = \dfrac{a+b}{x}$  [Equation 3]

wherein in Equation 1, $T_x$ is a $T_1$-dependent function value of a function represented by $f(T_1)$ in Equations 2 and 4, n is a positive integer of 1 or greater, and $\sigma_x$ is represented by Equation 3;
wherein in Equation 2 and Equation 4, $T_1$ is a thickness of the light absorbing layer comprising the any one point of the light absorbing layer on which the component analysis is conducted, and $T_0$ is 80 nm; and
wherein in Equation 3, a means an element content ratio of molybdenum (Mo), b means an element content ratio of titanium (Ti), and x means an element content ratio of oxygen (O) in Chemical Formula 1.

2. The decoration member of claim 1, wherein $T_x$ is greater than or equal to 0.01 and less than or equal to 0.5.

3. The decoration member of claim 1, wherein $\sigma_x$ is greater than or equal to 0.1 and less than or equal to 1.2.

4. The decoration member of claim 1, wherein a hue-angle h* in CIE Lch color space of the light absorbing layer is in a range of 315° to 360° or 0° to 150°.

5. The decoration member of claim 1, wherein the light reflective layer is a single layer or a multilayer comprising one or more types of materials selected from the group consisting of indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag); oxides thereof; nitrides thereof; oxynitrides thereof; carbon and carbon composites.

6. The member of claim 1, wherein the light absorbing layer has a refractive index of 0 to 8 at a wavelength of 400 nm.

7. The decoration member of claim 1, wherein the light absorbing layer has an extinction coefficient of greater than 0 and less than or equal to 4 at a wavelength of 400 nm.

8. The decoration member of claim 1, wherein the light absorbing layer comprises two or more points with different thicknesses.

9. The decoration member of claim 1, wherein the color developing layer further comprises a color film.

10. The decoration member of claim 1, wherein the color developing layer or the substrate comprises a pattern layer.

11. The decoration member of claim 10, wherein the pattern layer comprises a convex portion or concave portion shape having an asymmetric-structured cross-section.

12. The decoration member of claim 1, wherein the decoration member has dichroism of ΔE*ab>1.

13. The decoration member of claim 1, wherein the substrate comprises a plastic injection mold or a glass substrate for a cosmetic container.

14. The decoration member of claim 13, wherein the plastic injection mold comprises one or more types of polymer selected from the group consisting of polypropylene (PP), polystyrene (PS), polyvinyl acetate (PVAc), polyacrylate, polyethylene terephthalate (PET), polyvinyl chloride (PVC), polymethyl methacrylate (PMMA), ethylene-vinyl acetate copolymer (EVA), polycarbonate (PC), polyamide and styrene-acrylonitrile copolymer (SAN).

* * * * *